(12) United States Patent
Edwards et al.

(10) Patent No.: US 9,231,025 B2
(45) Date of Patent: Jan. 5, 2016

(54) CMOS-BASED THERMOELECTRIC DEVICE WITH REDUCED ELECTRICAL RESISTANCE

(71) Applicant: Texas Instruments Incorporated, Dallas, TX (US)

(72) Inventors: Henry Litzmann Edwards, Garland, TX (US); Kenneth James Maggio, Dallas, TX (US); Toan Tran, Rowlett, TX (US); Jihong Chen, Plano, TX (US); Jeffrey R. Debord, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/292,119

(22) Filed: May 30, 2014

(65) Prior Publication Data
US 2015/0349021 A1    Dec. 3, 2015

(51) Int. Cl.
| H01L 27/00 | (2006.01) |
|---|---|
| H01L 27/16 | (2006.01) |
| H01L 35/04 | (2006.01) |
| H01L 27/092 | (2006.01) |
| H01L 21/8238 | (2006.01) |
| H01L 21/265 | (2006.01) |
| H01L 37/00 | (2006.01) |

(52) U.S. Cl.
CPC .......... *H01L 27/16* (2013.01); *H01L 21/26513* (2013.01); *H01L 21/823814* (2013.01); *H01L 27/092* (2013.01); *H01L 35/04* (2013.01); *H01L 37/00* (2013.01)

(58) Field of Classification Search
CPC ........ H01L 27/16; H01L 27/092; H01L 37/00
See application file for complete search history.

(56) References Cited

U.S. PATENT DOCUMENTS

| 2009/0197376 A1* | 8/2009 | Kohno | C23C 16/345 438/197 |
|---|---|---|---|
| 2009/0266987 A1* | 10/2009 | Honda | G01J 5/02 250/338.4 |
| 2010/0032748 A1* | 2/2010 | Edwards | H01L 21/823814 257/327 |
| 2013/0104950 A1* | 5/2013 | Fornara | H01L 27/16 136/201 |

* cited by examiner

*Primary Examiner* — Ngan Ngo
(74) *Attorney, Agent, or Firm* — Michael A. Davis, Jr.; Frank D. Cimino

(57) ABSTRACT

An integrated circuit containing CMOS transistors and an embedded thermoelectric device may be formed by forming field oxide in isolation trenches to isolate the CMOS transistors and thermoelectric elements of the embedded thermoelectric device. N-type dopants are implanted into the substrate to provide at least $1 \times 10^{18}$ cm$^{-3}$ n-type dopants in n-type thermoelectric elements and the substrate under the field oxide between the n-type thermoelectric elements. P-type dopants are implanted into the substrate to provide at least $1 \times 10^{18}$ cm$^{-3}$ p-type dopants in p-type thermoelectric elements and the substrate under the field oxide between the p-type thermoelectric elements. The n-type dopants and p-type dopants may be implanted before the field oxide are formed, after the isolation trenches for the field oxide are formed and before dielectric material is formed in the isolation trenches, and/or after the field oxide is formed.

5 Claims, 22 Drawing Sheets

CMOS-BASED THERMOELECTRIC DEVICE WITH REDUCED ELECTRICAL RESISTANCE

BACKGROUND

The disclosures herein relate to integrated circuits, and in particular, to a CMOS based thermopile with reduced electrical resistance.

Thermoelectric devices which are fabricated as parts of integrated circuits, in which the thermoelectric elements are formed of silicon, tend to have poor performance due to higher electrical resistance through the thermoelectric elements and the substrate regions between adjacent thermoelectric elements than desired. Integrating low electrical resistance thermoelectric elements and connecting substrate regions into an integrated circuit containing complementary metal oxide semiconductor (CMOS) transistors has been problematic.

CROSS-REFERENCE TO RELATED APPLICATIONS

The following co-pending patent applications are related and hereby incorporated by reference in their entirety: U.S. patent application Ser. No. 14/292,188, filed simultaneously with this application) and U.S. patent application Ser. No. 14/292,281, filed simultaneously with this application). With their mention in this section, these patent applications are not admitted to be prior art with respect to the present invention.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing CMOS transistors and an embedded thermoelectric device may be formed by forming isolation trenches in a substrate, to concurrently define active areas for the CMOS transistors and thermoelectric elements of the embedded thermoelectric device. Dielectric material is formed in the isolation trenches to provide field oxide which laterally isolates the CMOS transistors and the thermoelectric elements. An n-type implant mask is formed over the substrate which exposes the areas for n-type thermoelectric elements and covers the area for the CMOS transistors and the areas for p-type thermoelectric elements. N-type dopants are implanted into the substrate exposed by the n-type implant mask to provide at least $1 \times 10^{18}$ cm$^{-3}$ n-type dopants in the areas for n-type thermoelectric elements and the substrate under the isolation trenches between the areas for the n-type thermoelectric elements. A p-type implant mask is formed over the substrate which exposes the areas for the p-type thermoelectric elements and covers the area for the CMOS transistors and the areas for the n-type thermoelectric elements. P-type dopants are implanted into the substrate exposed by the p-type implant mask to provide at least $1 \times 10^{18}$ cm$^{-3}$ p-type dopants in the areas for p-type thermoelectric elements and the substrate under the isolation trenches between the areas for the p-type thermoelectric elements. The n-type dopants and p-type dopants may be implanted before the isolation trenches are formed, after the isolation trenches are formed and before the dielectric material is formed in the isolation trenches, and/or after the dielectric material is formed in the isolation trenches.

DETAILED DESCRIPTION

The attached figures are not drawn to scale and they are provided merely to illustrate. Several aspects are described below with reference to example applications for illustration. It should be understood that numerous specific details, relationships, and methods are set forth to provide an understanding of the examples. One skilled in the relevant art, however, will readily recognize one or more of the specific details or with other methods may not be necessary. In other instances, well-known structures or operations are not shown in detail. The disclosures are not limited by the illustrated ordering of acts or events, as some acts may occur in different orders and/or concurrently with other acts or events. Furthermore, not all illustrated acts or events are required to implement a methodology.

An integrated circuit containing CMOS transistors and an embedded thermoelectric device may be formed by forming isolation trenches in a substrate, to concurrently define active areas for the CMOS transistors and thermoelectric elements of the embedded thermoelectric device. Dielectric material is formed in the isolation trenches to provide field oxide which laterally isolates the CMOS transistors and the thermoelectric elements. An n-type implant mask is formed over the substrate which exposes the areas for n-type thermoelectric elements and covers the area for the CMOS transistors and the areas for p-type thermoelectric elements. N-type dopants are implanted into the substrate exposed by the n-type implant mask to provide at least $1 \times 10^{18}$ cm$^{-3}$ n-type dopants in the areas for n-type thermoelectric elements and the substrate at least 100 nanometers under the isolation trenches between the areas for the n-type thermoelectric elements. A p-type implant mask is formed over the substrate which exposes the areas for the p-type thermoelectric elements and covers the area for the CMOS transistors and the areas for the n-type thermoelectric elements. P-type dopants are implanted into the substrate exposed by the p-type implant mask to provide at least $1 \times 10^{18}$ cm$^{-3}$ p-type dopants in the areas for p-type thermoelectric elements and the substrate at least 100 nanometers under the isolation trenches between the areas for the p-type thermoelectric elements. The n-type dopants and p-type dopants may be implanted before the isolation trenches are formed, after the isolation trenches are formed and before the dielectric material is formed in the isolation trenches, and/or after the dielectric material is formed in the isolation trenches.

Figure 1:
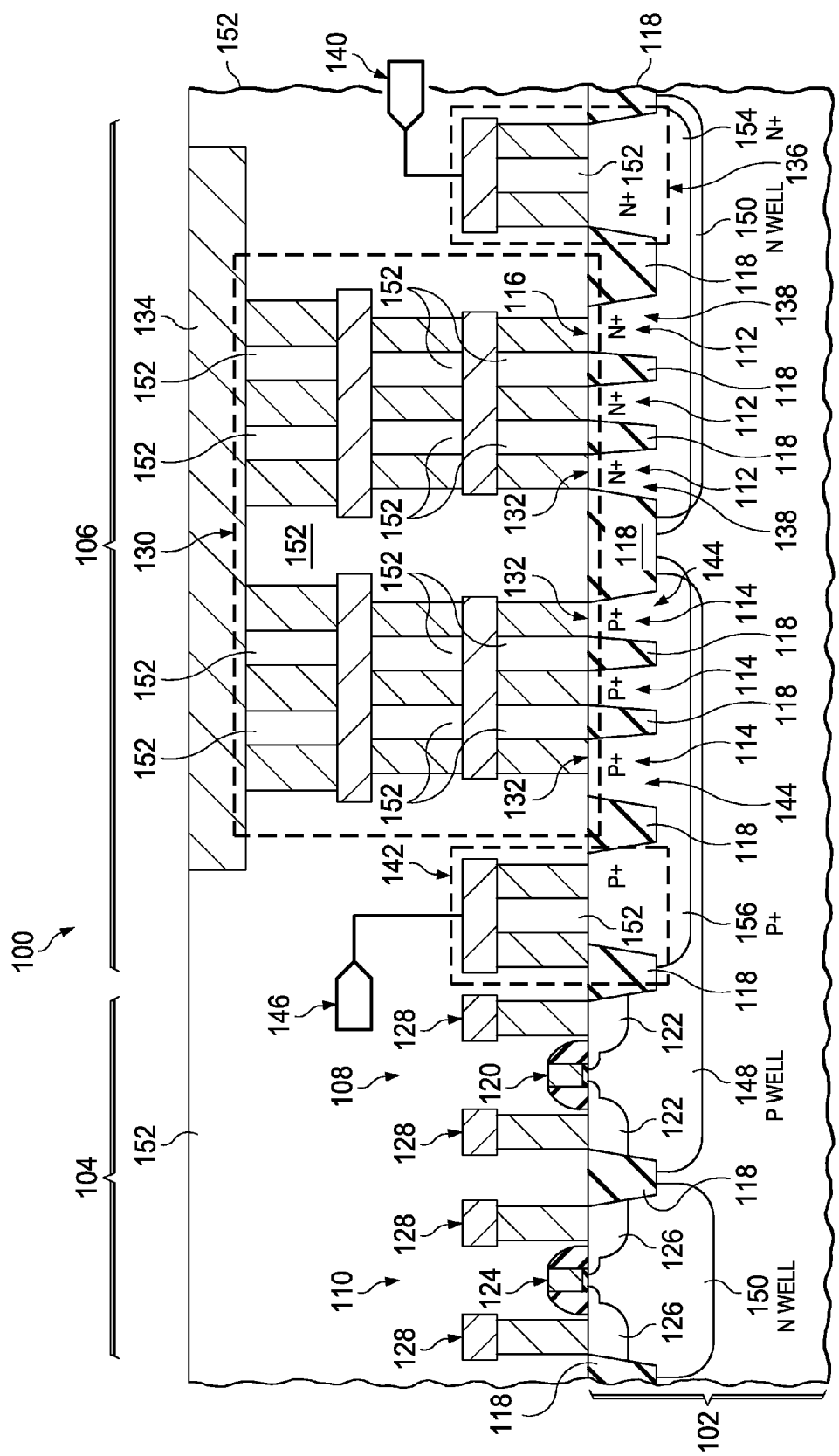
FIG. 1 is a cross section of an example integrated circuit containing CMOS transistors and an embedded thermoelectric device.

FIG. 1 is a cross section of an example integrated circuit containing CMOS transistors and an embedded thermoelectric device. The integrated circuit 100 is formed on a substrate 102 including silicon-based semiconductor material which may be for example a single crystal bulk silicon wafer or a silicon wafer with a silicon epitaxial layer. The integrated circuit 100 includes an area for the CMOS transistors 104 and the embedded thermoelectric device 106. The CMOS transistors 104 include an n-channel metal oxide semiconductor (NMOS) transistor 108 and a p-channel metal oxide semiconductor (PMOS) transistor 110. The embedded thermoelectric device 106 includes n-type thermoelectric elements 112 and p-type thermoelectric elements 114 in the substrate 102, extending to a top surface 116 of the substrate 102. The n-type thermoelectric elements 112 and p-type thermoelectric elements 114 are less than 300 nanometers wide at a narrowest position, for example at the top surface 116 of the substrate 102. The integrated circuit 100 includes field oxide 118 in isolation trenches laterally isolating active areas for the NMOS transistor 108, the PMOS transistor 110, the n-type thermoelectric elements 112 and p-type thermoelectric elements 114. The field oxide 118 may be formed by a shallow trench isolation (STI) process.

The NMOS transistor 108 includes a gate structure 120 over the substrate 102 and n-type source/drain regions 122 in the substrate 102 adjacent to and partially underlapping the gate structure 120. The PMOS transistor 110 includes a gate structure 124 over the substrate 102 and p-type source/drain regions 126 in the substrate 102 adjacent to and partially underlapping the gate structure 124. Metal interconnects 128 provide electrical connections to the n-type source/drain regions 122 and the p-type source/drain regions 126.

The embedded thermoelectric device 106 includes a metal interconnect structure 130 which connects upper ends 132 of the n-type thermoelectric elements 112 and the p-type thermoelectric elements 114, electrically and thermally, to a thermal node 134. The thermal node 134 may be, for example, an interconnect element in a top layer of metallization of the integrated circuit 100 as depicted in FIG. 1. The embedded thermoelectric device 106 may also include an n-type thermal tap 136 which connects lower ends 138 of the n-type thermoelectric elements 112, electrically and thermally, to a first terminal 140 of the embedded thermoelectric device 106, and a p-type thermal tap 142 which connects lower ends 144 of the p-type thermoelectric elements 114, electrically and thermally, to a second terminal 146 of the embedded thermoelectric device 106.

The NMOS transistor 108 and the p-type thermoelectric elements 114 are disposed in one or more p-type wells 148. The p-type well 148 of the NMOS transistor 108 and the p-type well 148 of the p-type thermoelectric elements 114 may be the same p-type well 148 as depicted in FIG. 1, or may be separate. The PMOS transistor 110 and the n-type thermoelectric elements 112 are disposed in one or more n-type wells 150. The n-type well 150 of the PMOS transistor 110 and the n-type well 150 of the n-type thermoelectric elements 112 may separate as depicted in FIG. 1, or may be the same n-type well 150.

A dielectric layer stack 152 is formed over the substrate 102 as part of a back-end-of-line (BEOL) structure of the integrated circuit 100. The dielectric layer stack 152 may include a pre-metal dielectric (PMD) layer and a plurality of inter-metal dielectric (IMD) layers and intra-level dielectric (ILD) layers. The dielectric layer stack 152 may include silicon dioxide, boron-phosphorus silicate glass (BPSG), low-k dielectric materials, and possibly silicon nitride and/or silicon carbide nitride cap layers and etch stop layers. The metal interconnects 128 on the NMOS and PMOS transistors 108 and 110, and the metal interconnect structure 130 and the thermal taps 136 and 142 of the embedded thermoelectric device 106 are disposed in the dielectric layer stack 152.

The n-type thermoelectric elements 112 are disposed in a heavily doped n-type region 154 in the substrate 102 which encompasses the n-type thermoelectric elements 112, the n-type thermal tap 136, and the substrate 102 between the n-type thermoelectric elements 112 at least 100 nanometers below the field oxide 118. The n-type region 154 has a doping density of at least $1 \times 10^{18}$ cm$^{-3}$, of phosphorus, arsenic and/or antimony, throughout the n-type thermoelectric elements 112, the n-type thermal tap 136, and the substrate 102 between the n-type thermoelectric elements 112 at least 100 nanometers below the field oxide 118.

The p-type thermoelectric elements 114 are disposed in a heavily doped p-type region 156 in the substrate 102 which encompasses the p-type thermoelectric elements 114, the p-type thermal tap 142, and the substrate 102 between the p-type thermoelectric elements 114 at least 100 nanometers below the field oxide 118. The p-type region 156 has an average doping density of at least $1 \times 10^{18}$ cm$^{-3}$, of boron, gallium and/or indium, throughout the p-type thermoelectric elements 114, the p-type thermal tap 142, and the substrate 102 between the p-type thermoelectric elements 114 at least 100 nanometers below the field oxide 118.

Disposing the n-type and p-type thermoelectric elements 112 and 114, the n-type and p-type thermal taps 136 and 142, and the substrate 102 between the thermoelectric elements 112 and 114 at least 100 nanometers below the field oxide 118, in the heavily doped n-type region 154 and the heavily doped p-type region 156, respectively, may advantageously improve performance of the embedded thermoelectric device 106 by reducing electrical resistance between the upper ends 132 of the n-type and p-type thermoelectric elements 112 and 114 to the top surface 116 of the substrate 102 in the n-type and p-type thermal taps 136 and 142. The n-type region 154 may have an average doping density of $3 \times 10^{18}$ cm$^{-3}$ to $1 \times 10^{20}$ cm$^{-3}$, which may further improve performance of the embedded thermoelectric device 106. Similarly, the p-type region 156 may have an average doping density of $3 \times 10^{18}$ cm$^{-3}$ to $1 \times 10^{20}$ cm$^{-3}$, which may further improve performance of the embedded thermoelectric device 106.

Figure 2A:
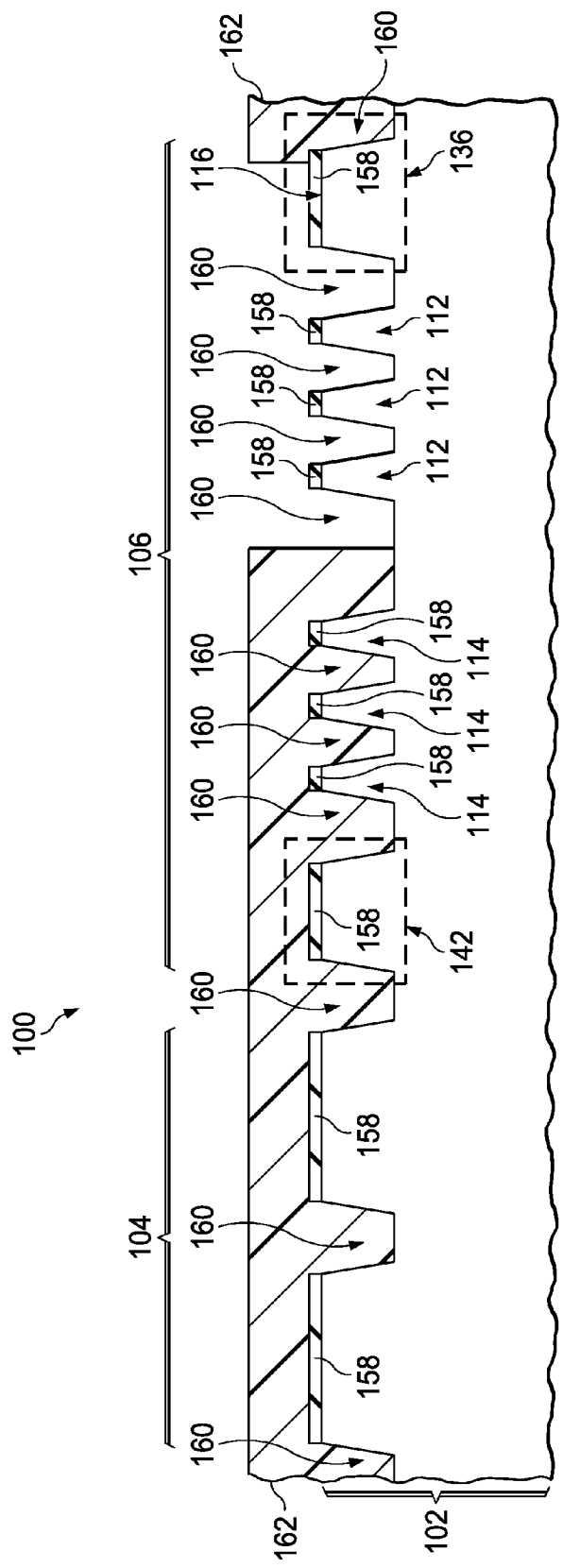
FIG. 2A through FIG. 2L are cross sections of the integrated circuit of FIG. 1, depicted in successive stages of an example fabrication sequence.

FIG. 2A through FIG. 2L are cross sections of the integrated circuit of FIG. 1, depicted in successive stages of an example fabrication sequence. Referring to FIG. 2A, the integrated circuit 100 is formed on the substrate 102 which may be substantially all silicon, with dopants such as boron or phosphorus at an average density of $1 \times 10^{16}$ cm$^{-3}$ to $3 \times 10^{17}$ cm$^{-3}$ proximate to the top surface 116 of the substrate 102. An isolation hard mask 158 is formed over the substrate 102 so as to cover active areas of the integrated circuit 100 and expose areas for subsequently-formed field oxide. The isolation hard mask 158 may include a layer of pad oxide, 5 nanometers to 20 nanometers thick, formed by thermal oxidation at the top surface 116, and a layer of silicon nitride, 50 nanometers to 150 nanometers thick, formed by low pressure chemical vapor deposition (LPCVD), on the layer of pad oxide. Isolation trenches 160 are formed in the substrate 102 in areas exposed by the isolation hard mask 158. The isolation trenches 160 may be 200 nanometers to 500 nanometers deep in the substrate 102, formed by a timed reactive ion etch (RIE) process. Thermal oxide may be formed at exposed sides and bottom surfaces of the isolation trenches 160 to electrically passivate the surfaces. The active areas include areas for n-type thermoelectric elements 112 and p-type thermoelectric elements 114 of the embedded thermoelectric device 106. The n-type and p-type thermoelectric elements 112 and 114 are less than 300 nanometers wide at a narrowest position, for example at the top surface 116 of the substrate 102. Forming the n-type and p-type thermoelectric elements 112 and 114 concurrently with the isolation trenches 160 in the area for the CMOS transistors 104 advantageously reduces fabrication cost and complexity of the integrated circuit 100.

An n-type region mask 162 is formed over the substrate 102 and the isolation hard mask 158 so as to expose the n-type thermoelectric elements 112 and the n-type thermal tap 136. The n-type region mask 162 covers the p-type thermoelectric elements 114, the p-type thermal tap 142 and the area for the CMOS transistors 104. The n-type region mask 162 may include, for example, photoresist formed by a photolithographic process, or may include silicon dioxide formed by a pattern and etch process.

Figure 2B:
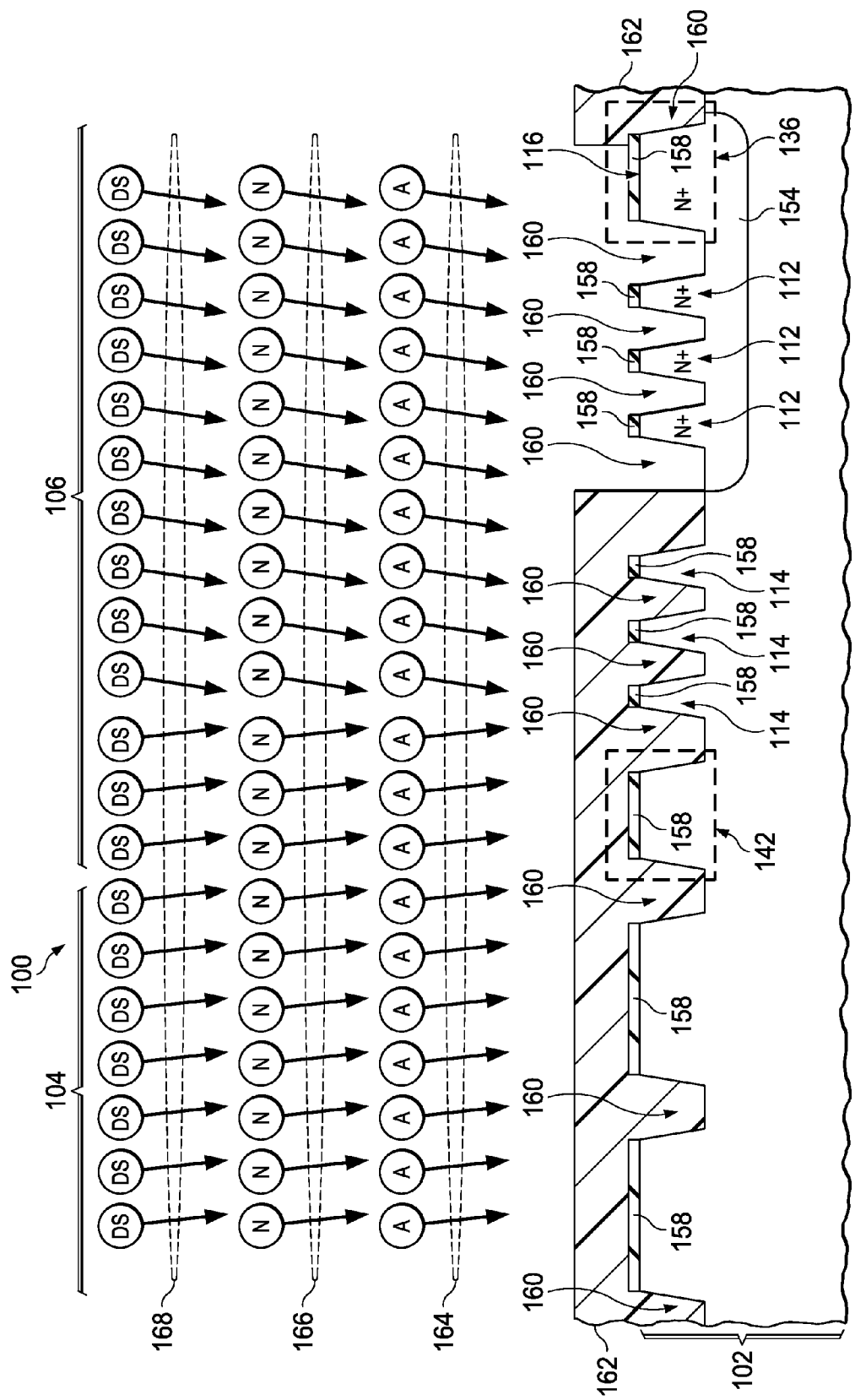

Referring to FIG. 2B, an amorphizing species 164 such as silicon or germanium may optionally be implanted into the substrate 102 exposed by the n-type region mask 162 to amorphize the substrate 102 in the n-type thermoelectric elements 112 and the n-type thermal tap 136. Amorphizing the substrate 102 may advantageously provide more uniform doping for subsequently implanted n-type dopants.

N-type dopants 166 are implanted into the substrate 102 exposed by the n-type region mask 162 to form the heavily doped n-type region 154. The n-type dopants 166 are implanted with sufficient dose to provide a doping density of at least $1 \times 10^{18}$ cm$^{-3}$ throughout the n-type thermoelectric elements 112, the n-type thermal tap 136, and the substrate 102 between the n-type thermoelectric elements 112 at least 100 nanometers below the field oxide 118. The n-type dopants 166 may include phosphorus, arsenic and/or antimony. Phosphorus may advantageously provide more uniform doping than arsenic and antimony. Antimony may advantageously reduce thermal conductivity in the n-type thermoelectric elements 112 due to phonon scattering compared to arsenic and phosphorus. Arsenic may provide a desired balance between uniform doping and reduced thermal conductivity.

A diffusion suppressant species 168 such as carbon and/or fluorine may optionally be implanted into the substrate 102 exposed by the n-type region mask 162 to reduce diffusion of the n-type dopants 166 during a subsequent anneal process. The diffusion suppressant species 168 may be implanted at a total dose of $1 \times 10^{14}$ cm$^{-2}$ to $1 \times 10^{16}$ cm$^{-2}$ to provide a density of at least $1 \times 10^{20}$ cm$^{-3}$. The diffusion suppressant species 168 may be implanted before, or after, the n-type dopants 166 are implanted.

Figure 2C:
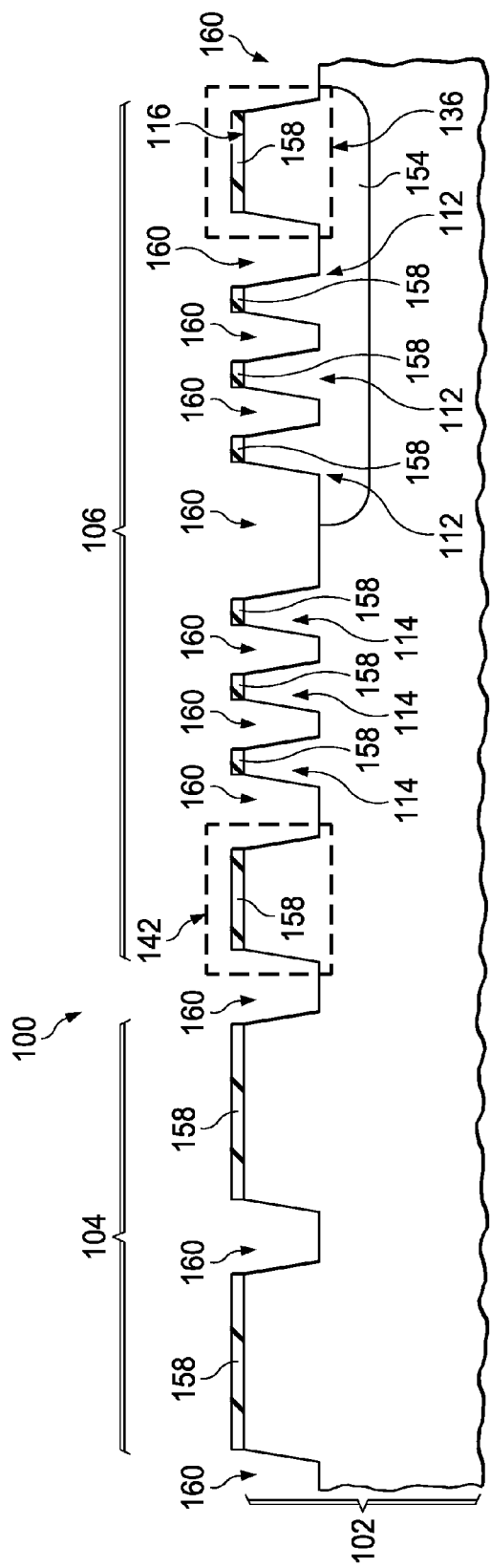

Referring to FIG. 2C, the n-type region mask 162 of FIG. 2B is removed. The substrate 102 may subsequently be annealed to activate the implanted n-type dopants 166 of FIG. 2B in the n-type region 154. Alternately, the substrate 102 may be annealed after implanting p-type dopants to form the p-type region 156 of FIG. 1. Photoresist in the n-type region mask 162 may be removed by an ash process followed by a wet clean process using an aqueous mixture of sulfuric acid and hydrogen peroxide. Silicon dioxide in the n-type region mask 162 may be removed by a dilute buffered aqueous solution of hydrofluoric acid, or an RIE process.

Figure 2D:
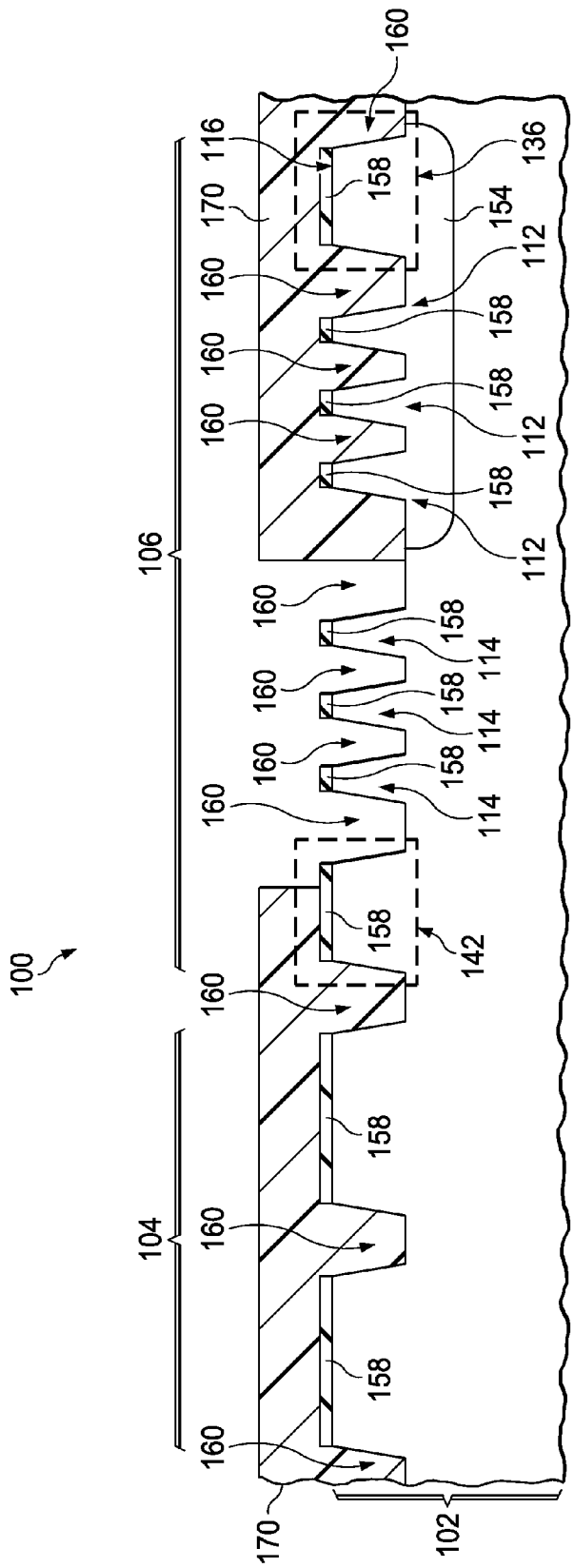

Referring to FIG. 2D, a p-type region mask 170 is formed over the substrate 102 and the isolation hard mask 158 so as to expose the p-type thermoelectric elements 114 and the p-type thermal tap 142. The p-type region mask 170 covers the n-type thermoelectric elements 112, the n-type thermal tap 136 and the area for the CMOS transistors 104. The p-type region mask 170 may be formed similarly to the n-type region mask 162 of FIG. 2A.

Figure 2E:
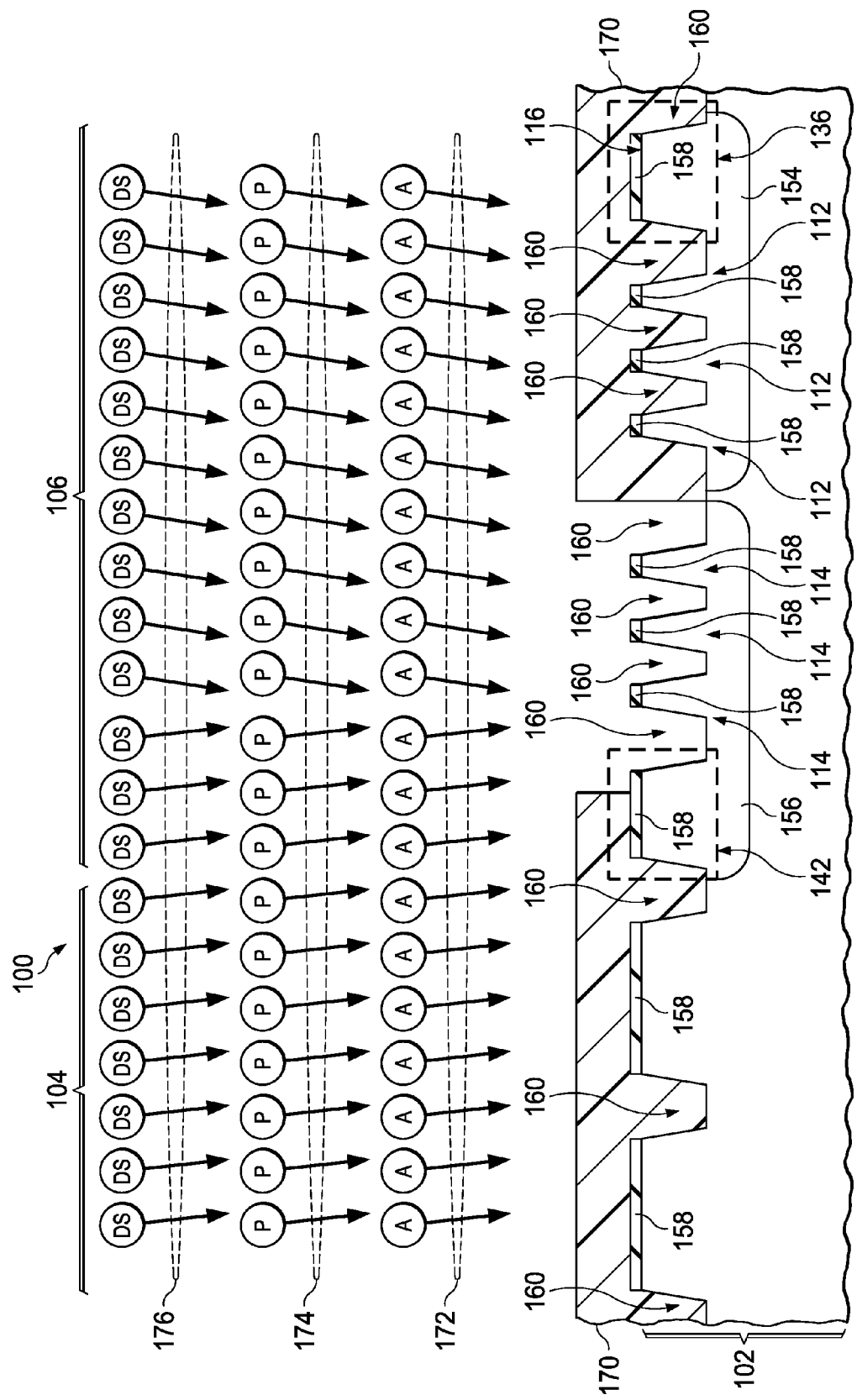

Referring to FIG. 2E, an amorphizing species 172 such as silicon or germanium may optionally be implanted into the substrate 102 exposed by the p-type region mask 170 to amorphize the substrate 102 in the p-type thermoelectric elements 114 and the p-type thermal tap 142. Amorphizing the substrate 102 may advantageously provide more uniform doping for subsequently implanted p-type dopants.

P-type dopants 174 are implanted into the substrate 102 exposed by the p-type region mask 170 to form the heavily doped p-type region 156. The p-type dopants 174 are implanted with sufficient dose to provide a doping density of at least $1 \times 10^{18}$ cm$^{-3}$ throughout the p-type thermoelectric elements 114, the p-type thermal tap 142, and the substrate 102 between the p-type thermoelectric elements 114 at least 100 nanometers below the field oxide 118. The p-type dopants 174 may include boron, gallium and/or indium. Boron may advantageously provide more uniform doping than gallium and indium. Indium may advantageously reduce thermal conductivity in the p-type thermoelectric elements 114 due to phonon scattering compared to boron and gallium. Gallium may provide a desired balance between uniform doping and reduced thermal conductivity.

A diffusion suppressant species 176 such as carbon and/or fluorine may optionally be implanted into the substrate 102 exposed by the p-type region mask 170 to reduce diffusion of the p-type dopants 174 during a subsequent anneal process. The diffusion suppressant species 176 may be implanted at a total dose of $1 \times 10^{14}$ cm$^{-2}$ to $1 \times 10^{16}$ cm$^{-2}$ to provide a density of at least $1 \times 10^{20}$ cm$^{-3}$. The diffusion suppressant species 176 may be implanted before, or after, the p-type dopants 174 are implanted.

Figure 2F:
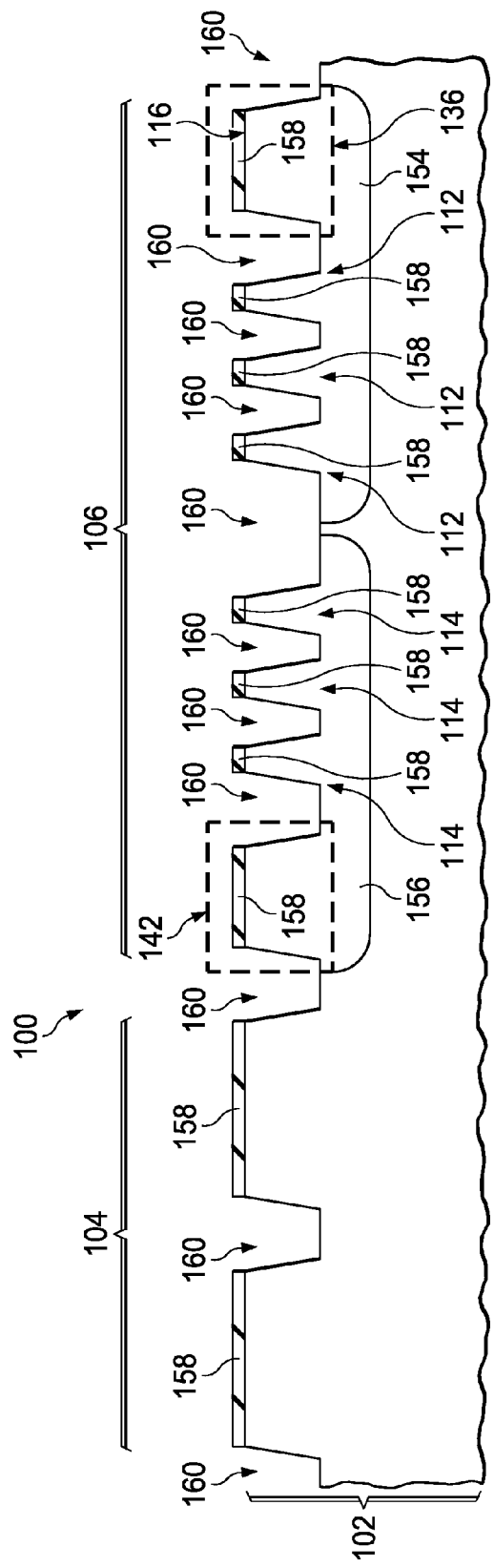

Referring to FIG. 2F, the p-type region mask 170 of FIG. 2E is removed. The substrate 102 may subsequently be annealed to activate the implanted p-type dopants 174 of FIG. 2E in the p-type region 156. The anneal process may also be used to activate the n-type dopants of FIG. 2C. The p-type region mask 170 may be removed as described in reference to FIG. 2C.

Figure 2G:
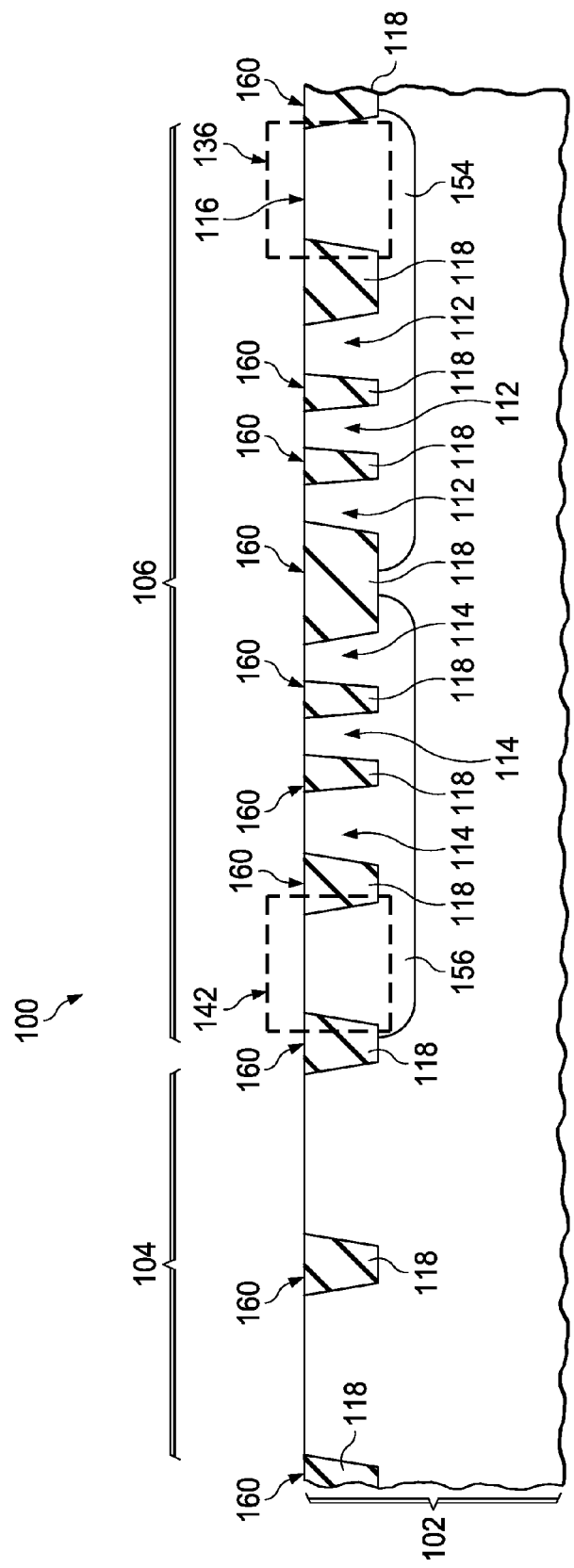

Referring to FIG. 2G, dielectric material is formed in the isolation trenches 160 and over the isolation hard mask 158 of FIG. 2F. The dielectric material may include one or more layers of silicon dioxide, and possibly silicon oxynitride and/or silicon nitride. The dielectric material may be formed by an atmospheric pressure chemical deposition (APCVD) process, a sub-atmospheric pressure chemical deposition (SACVD) process, a high density plasma (HDP) process, or a chemical vapor deposition substantially coplanar with the top surface 116 of the substrate 102. The isolation hard mask 158 is removed, leaving the dielectric material in the isolation trenches 160 to provide the field oxide 118 laterally isolating active areas of the integrated circuit 100.

Figure 2H:
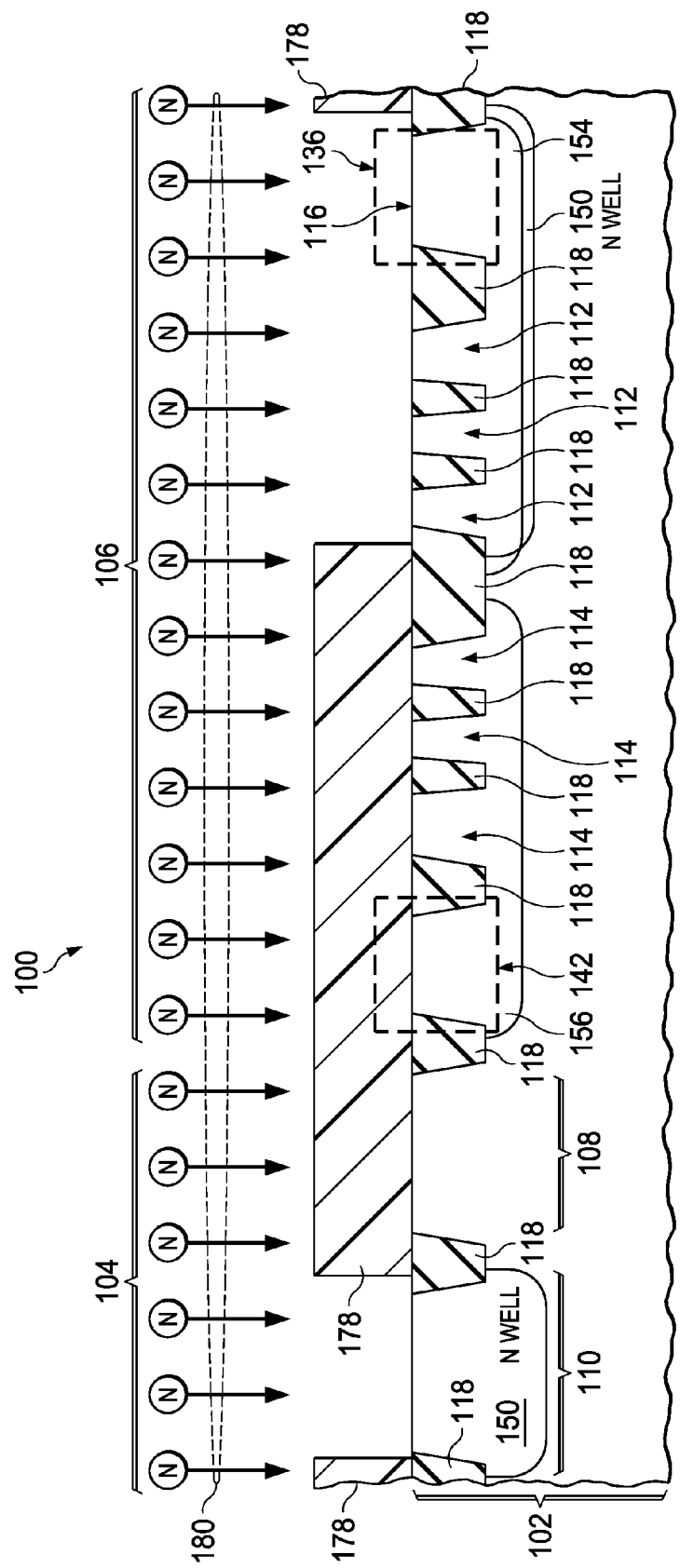

Referring to FIG. 2H, an n-type well mask 178 is formed over the substrate 102 and the field oxide 118 so as to expose an area for the PMOS transistor 110 in the area for the CMOS transistors 104 and the n-type thermoelectric elements 112 and the n-type thermal tap 136 in the area for the embedded thermoelectric device 106. The n-type well mask 178 covers an area for the NMOS transistor 108 in the area for the CMOS transistors 104 and the p-type thermoelectric elements 114 and the p-type thermal tap 142 in the area for the embedded thermoelectric device 106. The n-type well mask 178 may include photoresist formed by a photolithographic process. N-type dopants 180 such as phosphorus and arsenic are implanted into the substrate 102 in areas exposed by the n-type well mask 178. The n-type dopants 180 may be implanted at a total dose of $2 \times 10^{13}$ cm$^{-2}$ to $2 \times 10^{14}$ cm$^{-2}$ and energies of 40 keV to 500 keV. The n-type well mask 178 is subsequently removed, for example by an ash process followed by a wet clean process using an aqueous mixture of sulfuric acid and hydrogen peroxide. After the n-type well mask 178 is removed, the substrate 102 is annealed so as to activate the implanted n-type dopants 180 to form the n-type wells 150. Forming the n-type wells 150 concurrently in the area for the CMOS transistors 104 and the area for the embedded thermoelectric device 106 advantageously reduces fabrication cost and complexity of the integrated circuit 100.

Figure 2I:
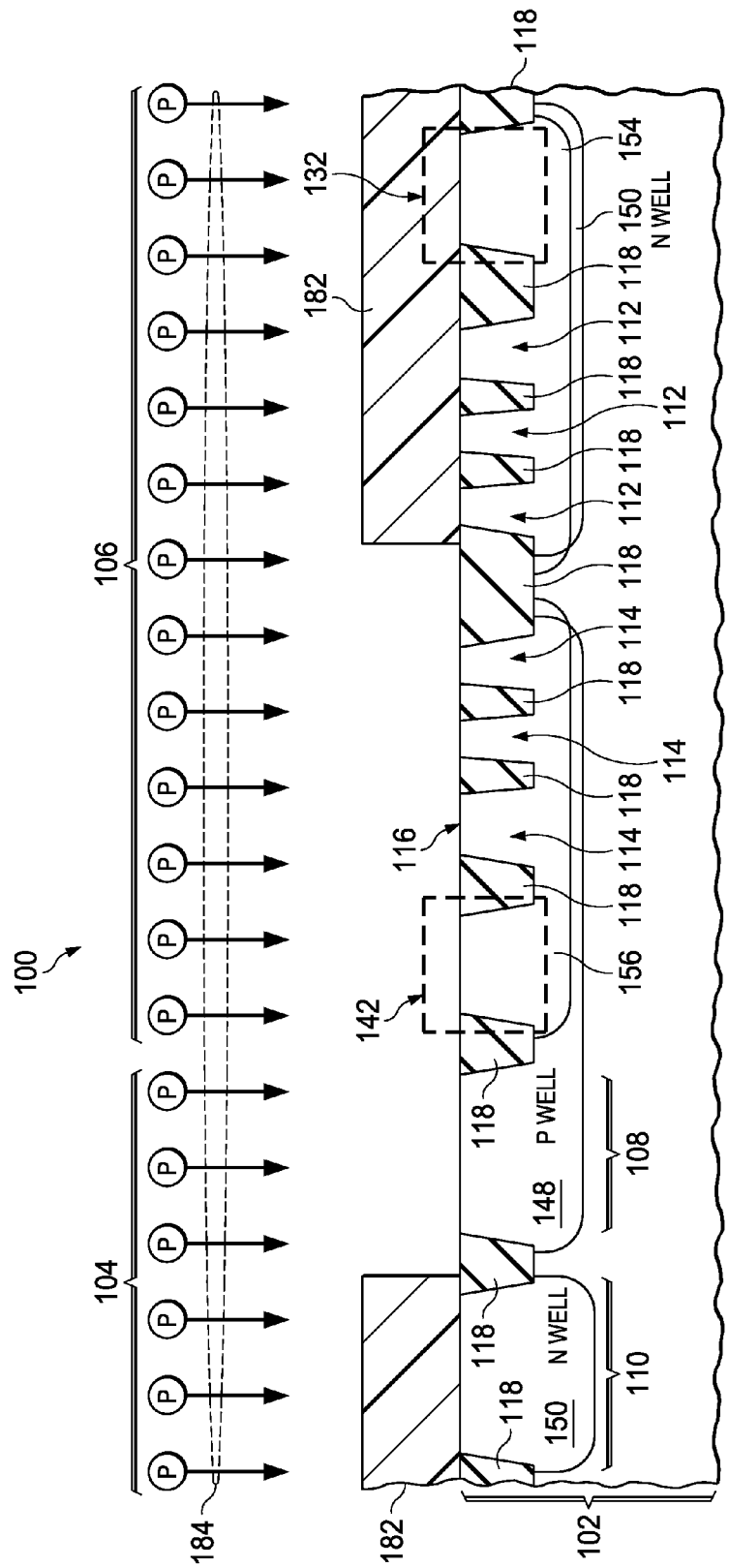

Referring to FIG. 2I, a p-type well mask 182 is formed over the substrate 102 and the field oxide 118 so as to expose an area for the NMOS transistor 108 in the area for the CMOS transistors 104 and the p-type thermoelectric elements 114 and the p-type thermal tap 142 in the area for the embedded thermoelectric device 106. The p-type well mask 182 covers an area for the PMOS transistor 110 in the area for the CMOS transistors 104 and the n-type thermoelectric elements 112 and the n-type thermal tap 136 in the area for the embedded thermoelectric device 106. The p-type well mask 182 may be formed similarly to the n-type well mask 178 of FIG. 2H. P-type dopants 184 such as boron are implanted into the substrate 102 in areas exposed by the p-type well mask 182. The p-type dopants 184 may be implanted at a total dose of $2 \times 10^{13}$ cm$^{-2}$ to $2 \times 10^{14}$ cm$^{-2}$ and energies of 10 keV to 250 keV. The p-type well mask 182 is subsequently removed, for example as described in reference to FIG. 2H. After the p-type well mask 182 is removed, the substrate 102 is annealed so as to activate the implanted p-type dopants 184 to form the p-type well 148. Forming the p-type wells 148 concurrently in the area for the CMOS transistors 104 and the area for the embedded thermoelectric device 106 advantageously reduces fabrication cost and complexity of the integrated circuit 100.

Figure 2J:
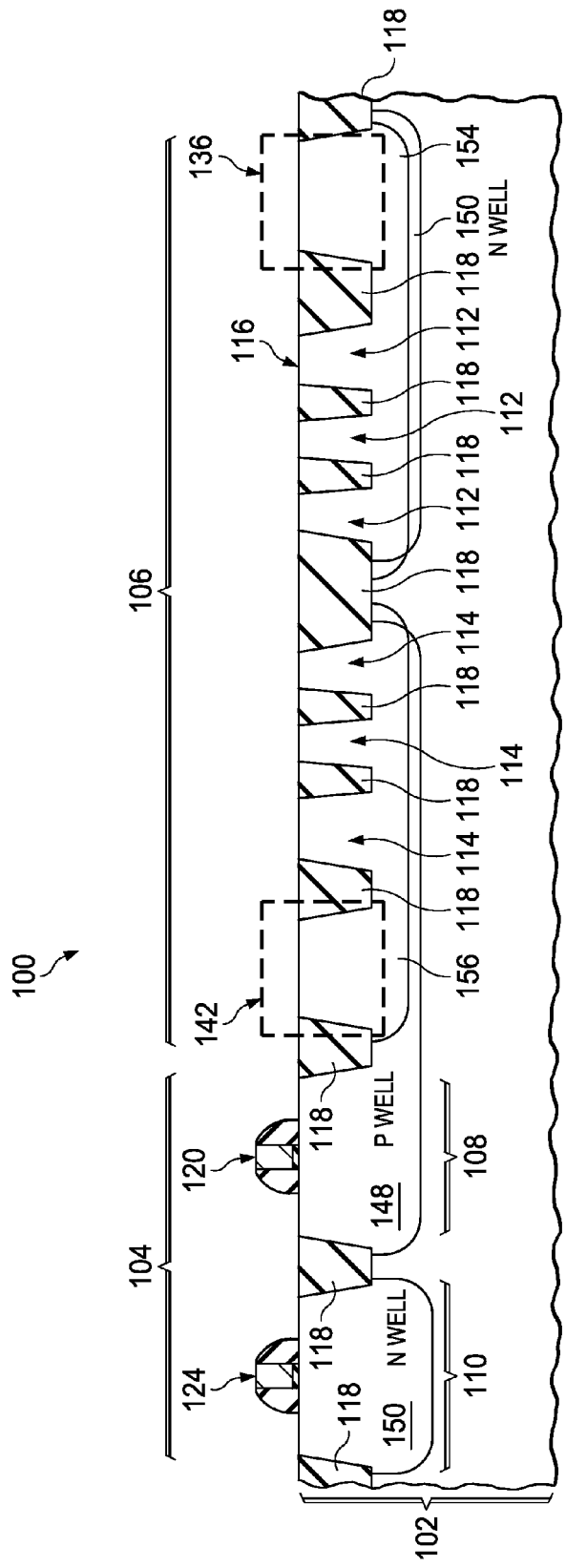

Referring to FIG. 2J, the gate structure 120 of the NMOS transistor 108 and the gate structure 124 of the PMOS transistor 110 are formed over the substrate 102. Portions or all of the gate structure 120 of the NMOS transistor 108 and the gate structure 124 of the PMOS transistor 110 may be formed concurrently.

Figure 2K:
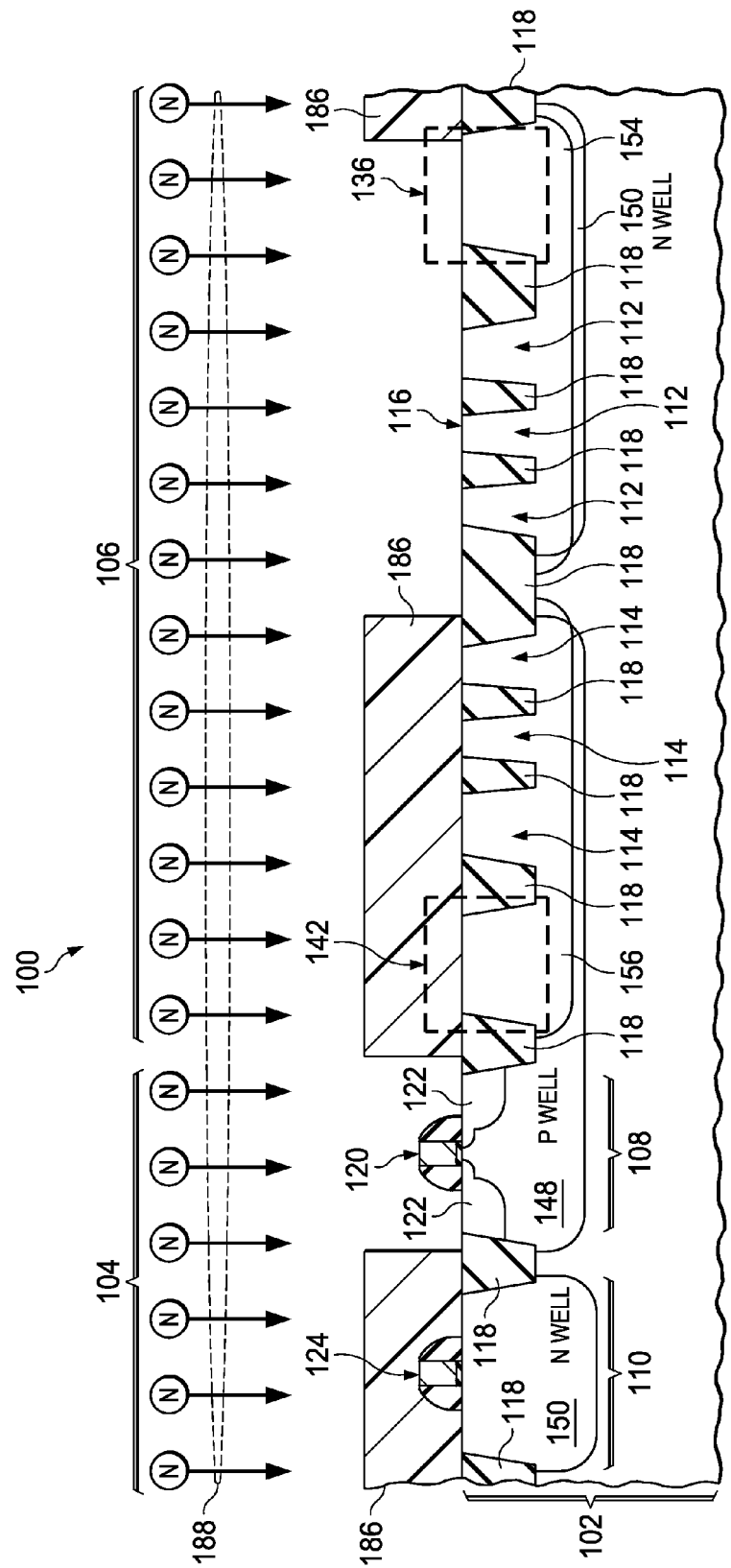

Referring to FIG. 2K, an n-channel source/drain (NSD) mask 186 is formed over an existing top surface of the integrated circuit 100 so as to expose the area for the NMOS transistor 108, the n-type thermoelectric elements 112 and the n-type thermal tap 136. The NSD mask 186 covers the area for the PMOS transistor 110, the p-type thermoelectric elements 114 and the p-type thermal tap 142. The NSD mask 186 may include photoresist formed by a photolithographic process. N-type dopants 188 such as phosphorus, arsenic and possibly antimony are implanted into the substrate 102 in the areas exposed by the NSD mask 186 to form the n-type source/drain regions 122 in the substrate 102 adjacent to and partially underlapping the gate structure 120 of the NMOS transistor 108. The n-type dopants 188 are also implanted into the n-type thermoelectric elements 112 and the n-type thermal tap 136, advantageously augmenting the n-type dopants already present. The NSD mask 186 is subsequently removed, as described in reference to FIG. 2H.

Figure 2L:
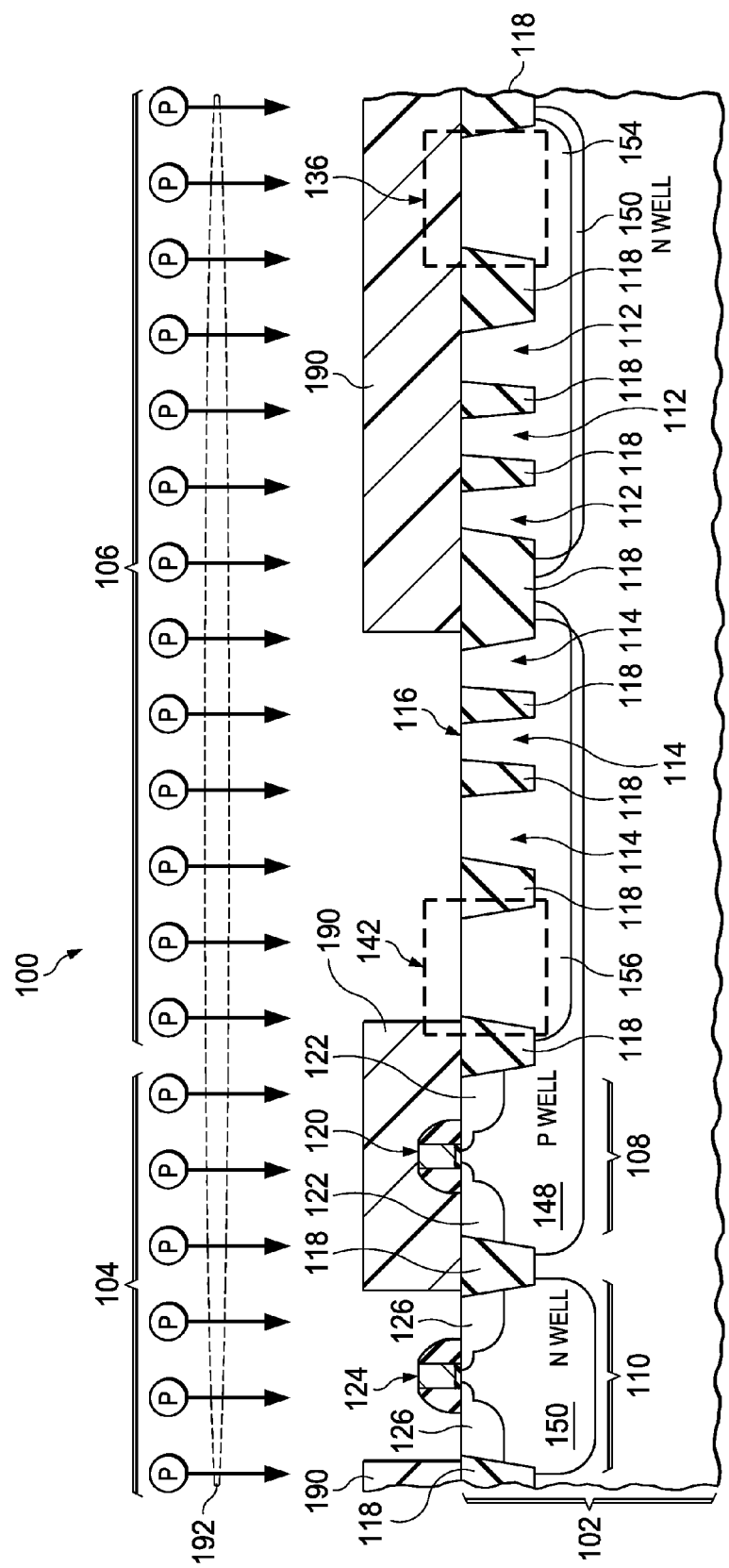

Referring to FIG. 2L, a p-channel source/drain (PSD) mask 190 is formed over an existing top surface of the integrated circuit 100 so as to expose the area for the PMOS transistor 110, the p-type thermoelectric elements 114 and the p-type thermal tap 142. The PSD mask 190 covers the area for the NMOS transistor 108, the n-type thermoelectric elements 112 and the n-type thermal tap 136. The PSD mask 190 may be formed similarly to the NSD mask 186 of FIG. 2K. P-type dopants 192 such as boron, gallium and possibly indium are implanted into the substrate 102 in the areas exposed by the PSD mask 190 to form the p-type source/drain regions 126 in the substrate 102 adjacent to and partially underlapping the gate structure 124 of the PMOS transistor 110. The p-type dopants 192 are also implanted into the p-type thermoelectric elements 114 and the p-type thermal tap 142, advantageously augmenting the p-type dopants already present. The PSD mask 190 is subsequently removed, as described in reference to FIG. 2H. Formation of the integrated circuit 100 is continued with formation of dielectric layers and metal interconnects to provide the structure of FIG. 1.

Figure 3:
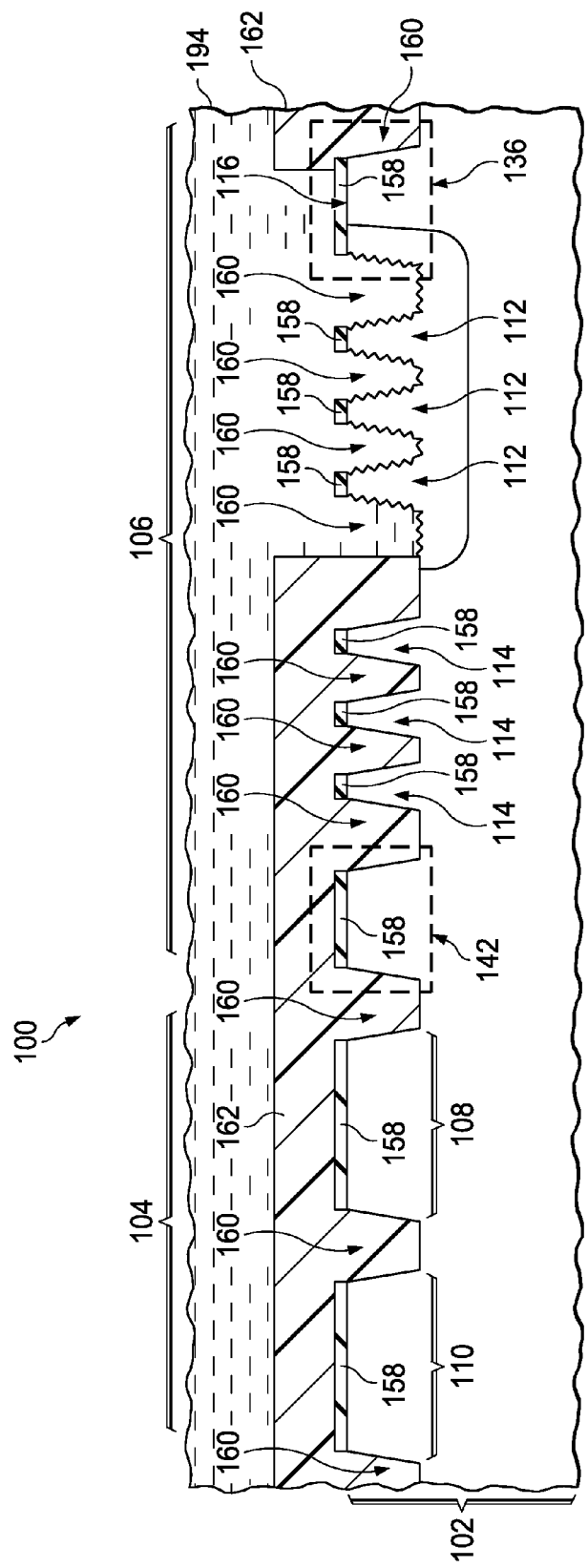
FIG. 3 is a cross section of the integrated circuit of FIG. 1, depicting an optional fabrication step.

FIG. 3 is a cross section of the integrated circuit of FIG. 1, depicting an optional fabrication step. The n-type region mask 162 is formed over the substrate 102 and the isolation hard mask 158 so as to expose the n-type thermoelectric elements 112 and the n-type thermal tap 136, as described in reference to FIG. 2A. The top surface 116 of the substrate 102 in the n-type thermoelectric elements 112 and the n-type thermal tap 136 is protected by the isolation hard mask 158. Side and bottom surfaces of the isolation trenches 160 at the n-type thermoelectric elements 112 which are exposed by the n-type region mask 162 are roughened by an etch process 194 such as an aqueous phosphoric acid etch process 194. Forming the roughened side surfaces of the isolation trenches 160 may advantageously reduce thermal conductance in the n-type thermoelectric elements 112 by increasing phonon scattering at the roughened surfaces. The side and bottom surfaces of the isolation trenches 160 may be roughened before or after the n-type dopants 166 are implanted into the substrate 102 exposed by the n-type region mask 162 as described in reference to FIG. 2B. The side and bottom surfaces of the isolation trenches 160 at the p-type thermoelectric elements 114 may be similarly roughened by exposing the integrated circuit 100 to an etch process while the p-type region mask 170 of FIG. 2E is in place, thereby accruing similar advantages.

Figure 4:
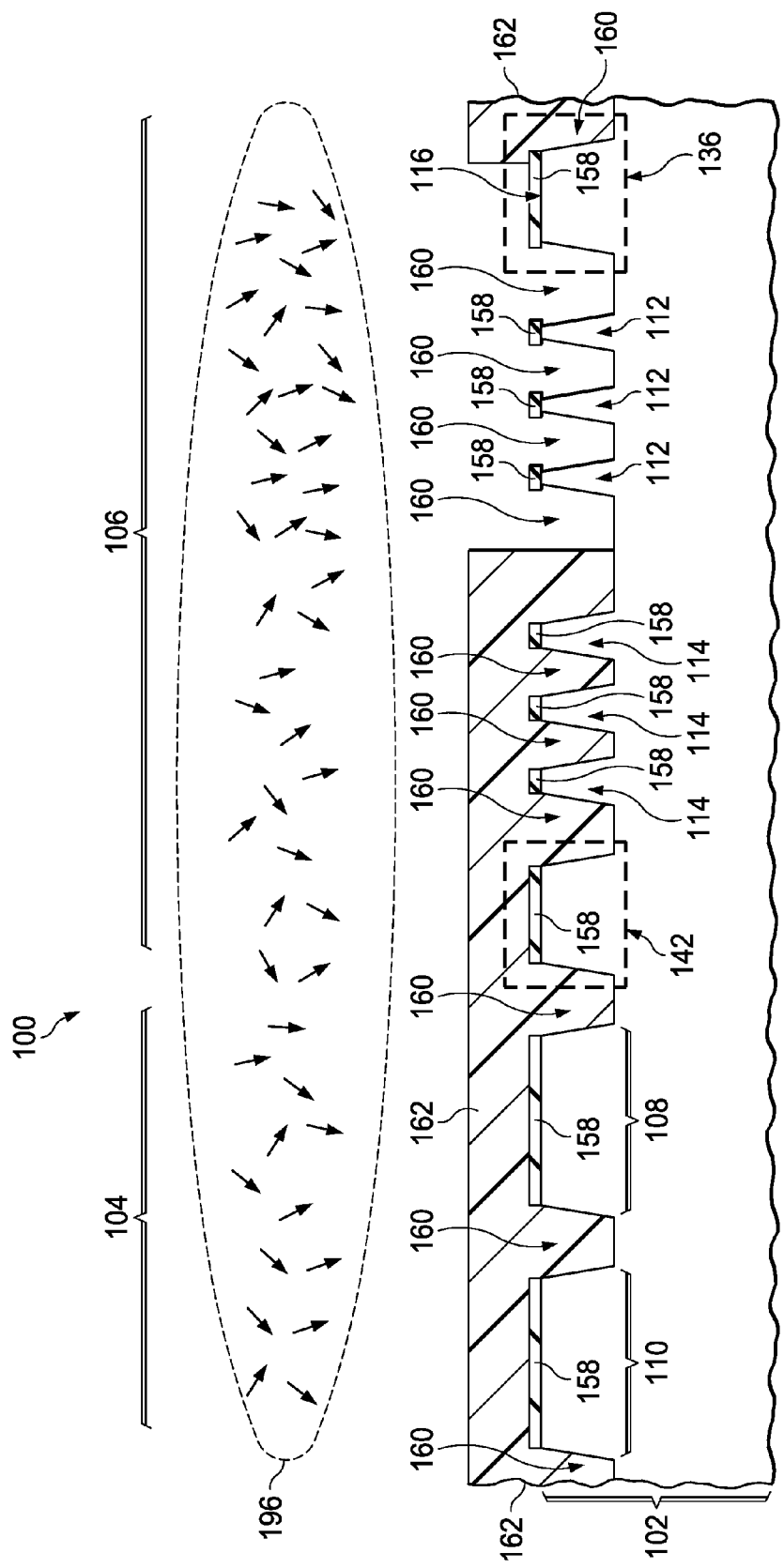
FIG. 4 is a cross section of the integrated circuit of FIG. 1, depicting another optional fabrication step.

FIG. 4 is a cross section of the integrated circuit of FIG. 1, depicting another optional fabrication step. The n-type region mask 162 is formed over the substrate 102 and the isolation hard mask 158 so as to expose the n-type thermoelectric elements 112 and the n-type thermal tap 136, as described in reference to FIG. 2A. The top surface 116 of the substrate 102 in the n-type thermoelectric elements 112 and the n-type thermal tap 136 is protected by the isolation hard mask 158. Semiconductor material of the substrate 102 at side and bottom surfaces of the isolation trenches 160 exposed by the n-type region mask 162 is removed by an isotropic etch process 196 such as an isotropic plasma etch process 196 which reduces lateral dimensions of the n-type thermoelectric elements 112. Reducing the lateral dimensions of the n-type thermoelectric elements 112 may advantageously reduce thermal conductance in the n-type thermoelectric elements 112 by increasing phonon scattering. The semiconductor material may be removed from the side and bottom surfaces of the isolation trenches 160 before or after the n-type dopants 166 are implanted into the substrate 102 exposed by the n-type region mask 162 as described in reference to FIG. 2B. Semiconductor material may be removed from side and bottom surfaces of the isolation trenches 160 at the p-type thermoelectric elements 114 by exposing the integrated circuit 100 to an isotropic etch process while the p-type region mask 170 of FIG. 2E is in place, thereby accruing similar advantages.

Figure 5A:
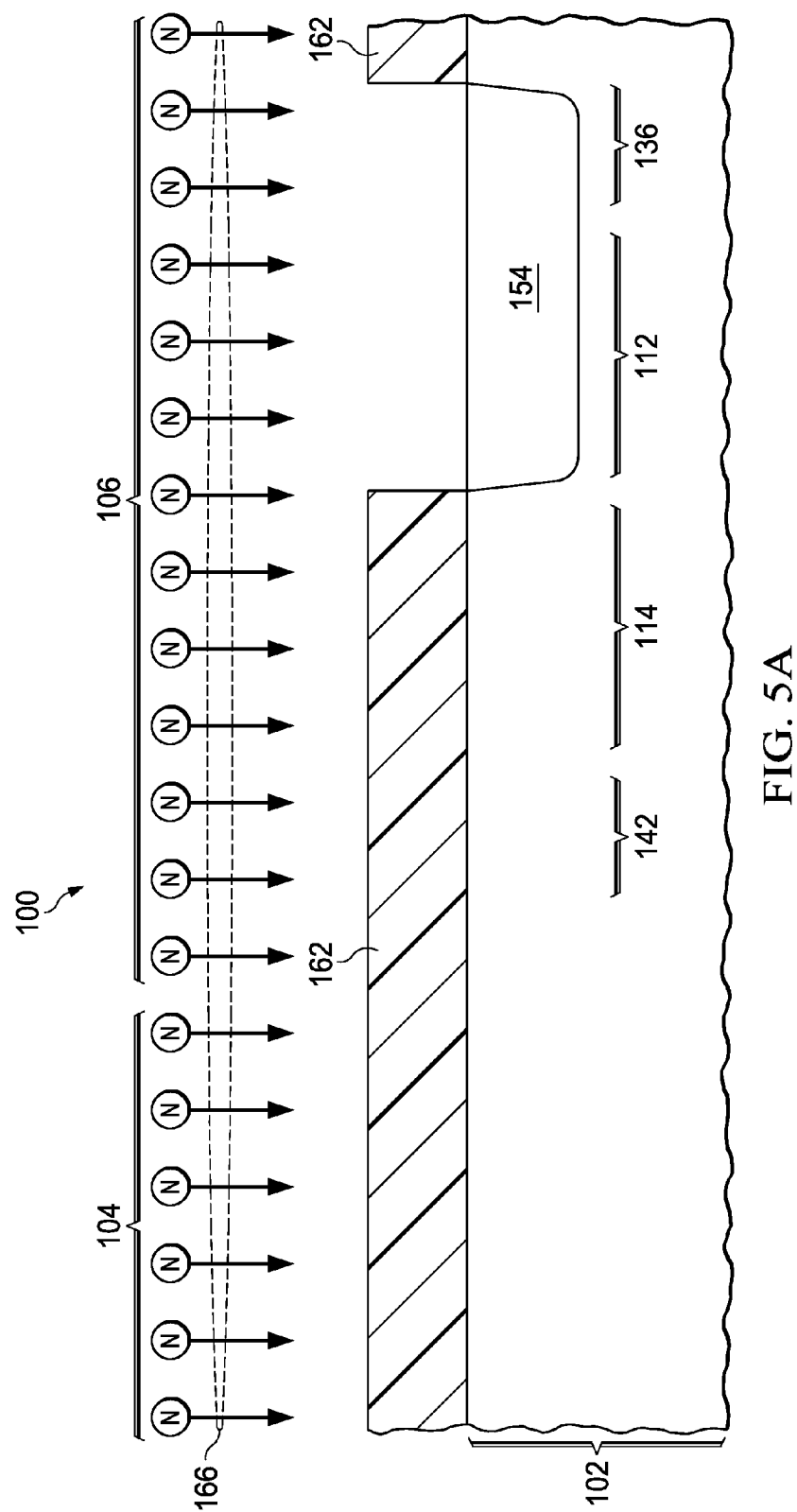
FIG. 5A and FIG. 5B are cross sections of the integrated circuit of FIG. 1, depicted in successive stages of an alternate fabrication sequence from the sequence of FIG. 2A through FIG. 2F.
Figure 5B:
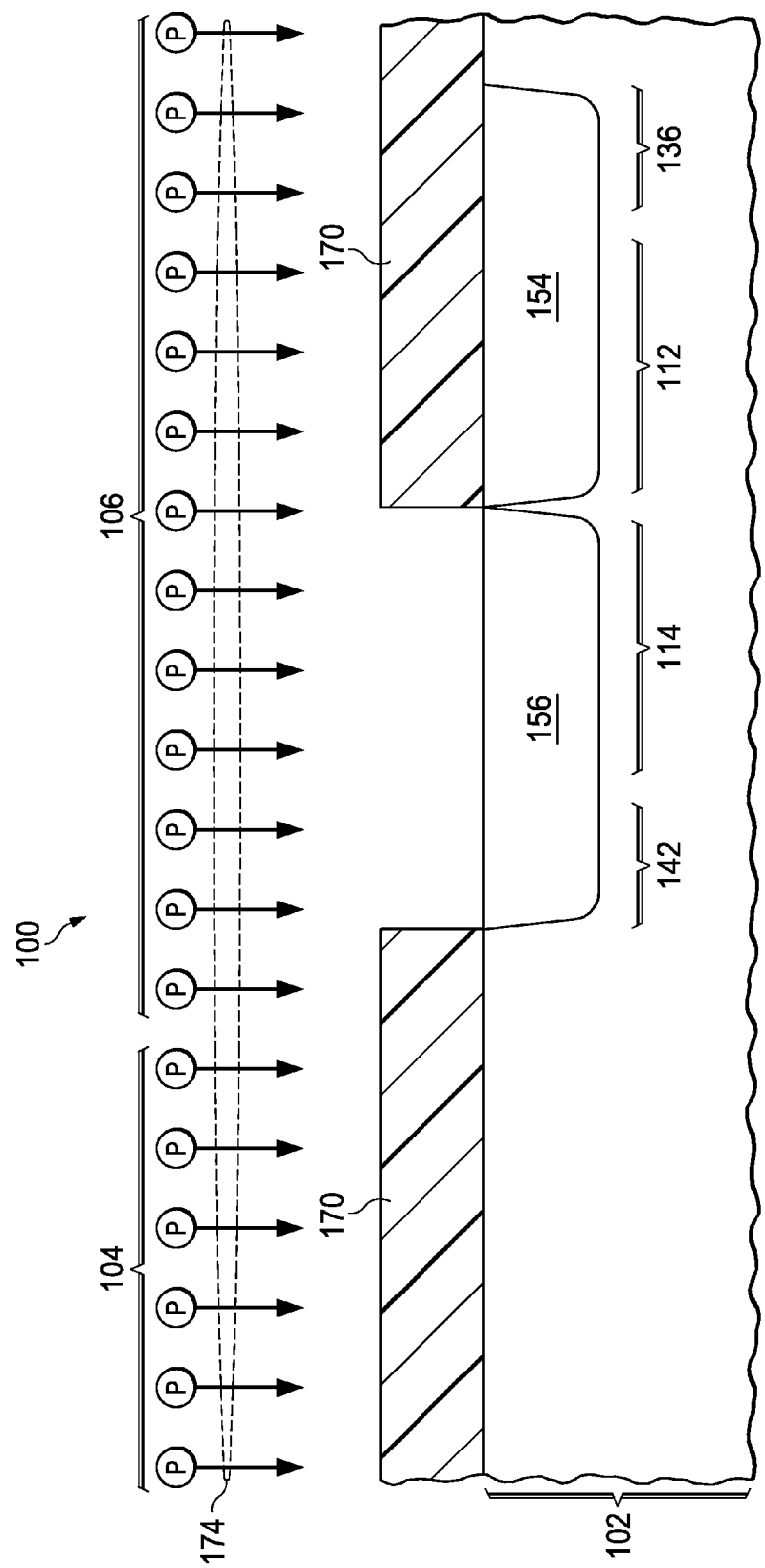

FIG. 5A and FIG. 5B are cross sections of the integrated circuit of FIG. 1, depicted in successive stages of an alternate fabrication sequence from the sequence of FIG. 2A through FIG. 2F. Referring to FIG. 5A, the n-type region mask 162 is formed over the substrate 102 prior to forming the isolation trenches 160 of FIG. 2A. The n-type region mask 162 exposes the area for the n-type thermoelectric elements 112 and the n-type thermal tap 136. The n-type region mask 162 covers the area for the p-type thermoelectric elements 114 and the p-type thermal tap 142 and the area for the CMOS transistors 104. The n-type dopants 166 are implanted into the substrate 102 in the area for the n-type thermoelectric elements 112 and the n-type thermal tap 136 to form the heavily doped n-type region 154. The n-type dopants 166 may be implanted at a low tilt angle, for example 4 degrees to 7 degrees. The n-type dopants 166 are implanted with sufficient dose to provide a doping density of at least $1 \times 10^{18}$ cm$^{-3}$ throughout the subsequently formed n-type thermoelectric elements 112, the n-type thermal tap 136, and the substrate 102 between the n-type thermoelectric elements 112 at least 100 nanometers below the subsequently formed field oxide 118. The n-type dopants 166 may include phosphorus, arsenic and/or antimony, as described in reference to FIG. 2B. An amorphizing species and/or a diffusion suppressant species may optionally be implanted while the n-type region mask 162 is in place, as described in reference to FIG. 2B. The n-type region mask 162 is subsequently removed. Forming the n-type region mask 162 prior to forming the isolation trenches 160 may simplify formation and removal of the n-type region mask 162, advantageously reducing cost and fabrication complexity of the integrated circuit 100.

Referring to FIG. 5B, the p-type region mask 170 is formed over the substrate 102 prior to forming the isolation trenches 160. The p-type region mask 170 exposes the area for the p-type thermoelectric elements 114 and the p-type thermal tap 142, and covers the area for the n-type thermoelectric elements 112 and the n-type thermal tap 136 and the area for the CMOS transistors 104. The p-type dopants 172 are implanted into the substrate 102 in the area for the p-type thermoelectric elements 114 and the p-type thermal tap 142 to form the heavily doped p-type region 156. The p-type dopants 172 may be implanted at a low tilt angle. The p-type dopants 172 are implanted with sufficient dose to provide a doping density of at least $1 \times 10^{18}$ cm$^{-3}$ throughout the subsequently formed p-type thermoelectric elements 114, the p-type thermal tap 142, and the substrate 102 between the p-type thermoelectric elements 114 at least 100 nanometers below the subsequently formed field oxide 118. The p-type dopants 172 may include boron, gallium and/or indium, as described in reference to FIG. 2E. An amorphizing species and/or a diffusion suppressant species may optionally be implanted while the p-type region mask 170 is in place, as described in reference to FIG. 2E. The p-type region mask 170 is subsequently removed. Forming the p-type region mask 170 prior to forming the isolation trenches 160 may accrue similar advantages to those described in reference to FIG. 5A. Subsequently, the field oxide 118 of FIG. 1 is formed and formation of the integrated circuit 100 is continued as described in reference to FIG. 2H et seq.

Figure 6A:
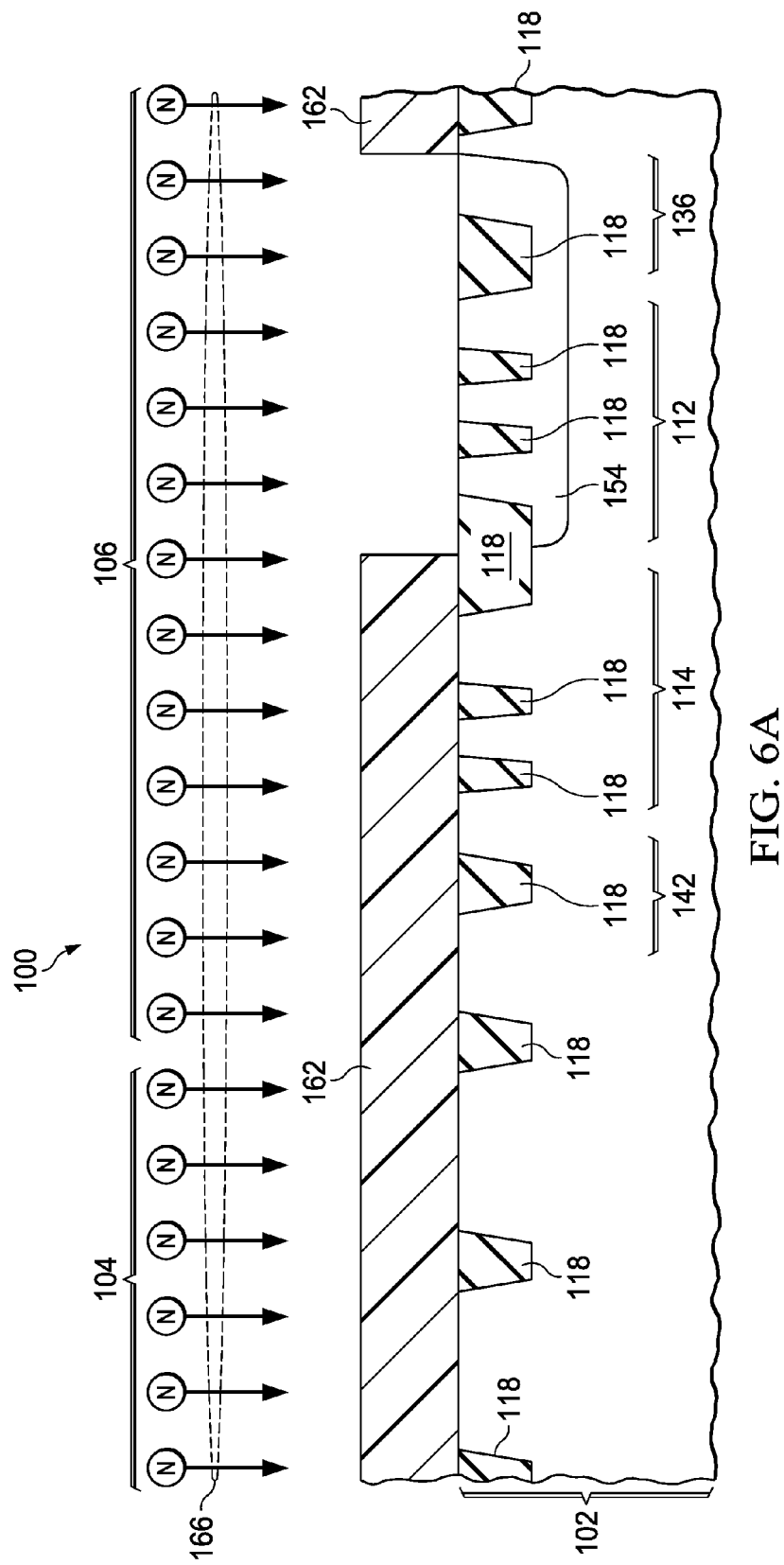
FIG. 6A and FIG. 6B are cross sections of the integrated circuit of FIG. 1, depicted in successive stages of another alternate fabrication sequence from the sequence of FIG. 2A through FIG. 2F.
Figure 6B:
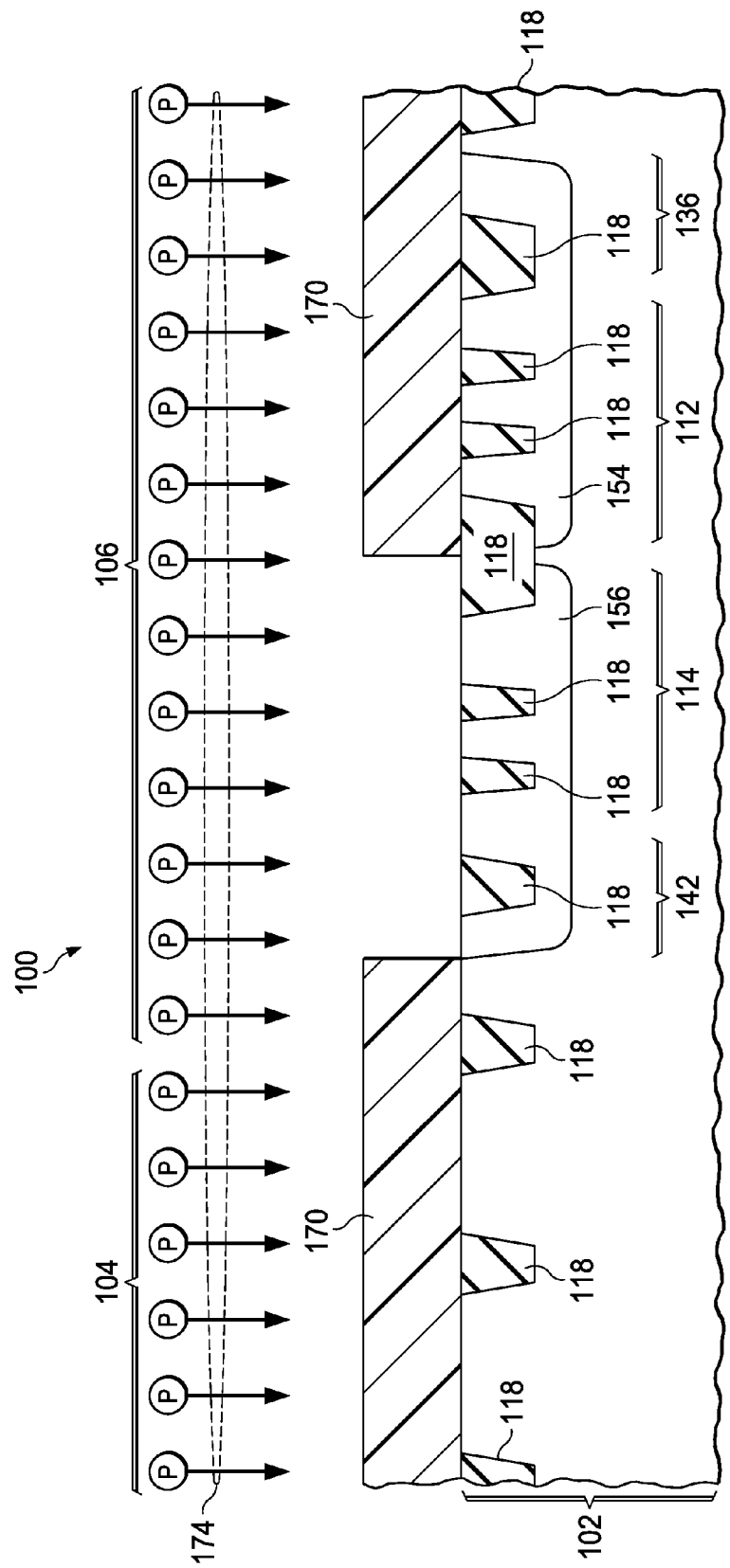

FIG. 6A and FIG. 6B are cross sections of the integrated circuit of FIG. 1, depicted in successive stages of another alternate fabrication sequence from the sequence of FIG. 2A through FIG. 2F. Referring to FIG. 6A, the n-type region mask 162 is formed over the substrate 102 after forming the field oxide 118. The n-type region mask 162 exposes the area for the n-type thermoelectric elements 112 and the n-type thermal tap 136. The n-type region mask 162 covers the area for the p-type thermoelectric elements 114 and the p-type thermal tap 142 and the area for the CMOS transistors 104. The n-type dopants 166 are implanted into the substrate 102 in the area for the n-type thermoelectric elements 112 and the n-type thermal tap 136 to form the heavily doped n-type region 154. The n-type dopants 166 may be implanted as described in reference to FIG. 5A. An amorphizing species and/or a diffusion suppressant species may optionally be implanted while the n-type region mask 162 is in place, as described in reference to FIG. 2B. The n-type region mask 162 is subsequently removed. Forming the n-type region mask 162 after forming the field oxide 118 may simplify formation and removal of the n-type region mask 162, advantageously reducing cost and fabrication complexity of the integrated circuit 100.

Referring to FIG. 6B, the p-type region mask 170 is formed over the substrate 102 prior after the field oxide 118. The p-type region mask 170 exposes the area for the p-type thermoelectric elements 114 and the p-type thermal tap 142, and covers the area for the n-type thermoelectric elements 112 and the n-type thermal tap 136 and the area for the CMOS transistors 104. The p-type dopants 172 are implanted into the substrate 102 in the area for the p-type thermoelectric elements 114 and the p-type thermal tap 142 to form the heavily doped p-type region 156. The p-type dopants 172 may be implanted as described in reference to FIG. 5B. An amorphizing species and/or a diffusion suppressant species may optionally be implanted while the p-type region mask 170 is in place, as described in reference to FIG. 2E. The p-type region mask 170 is subsequently removed. Forming the p-type region mask 170 after forming the field oxide 118 may accrue similar advantages to those described in reference to FIG. 6A. Subsequently, formation of the integrated circuit 100 is continued as described in reference to FIG. 2H et seq.

Figure 7:
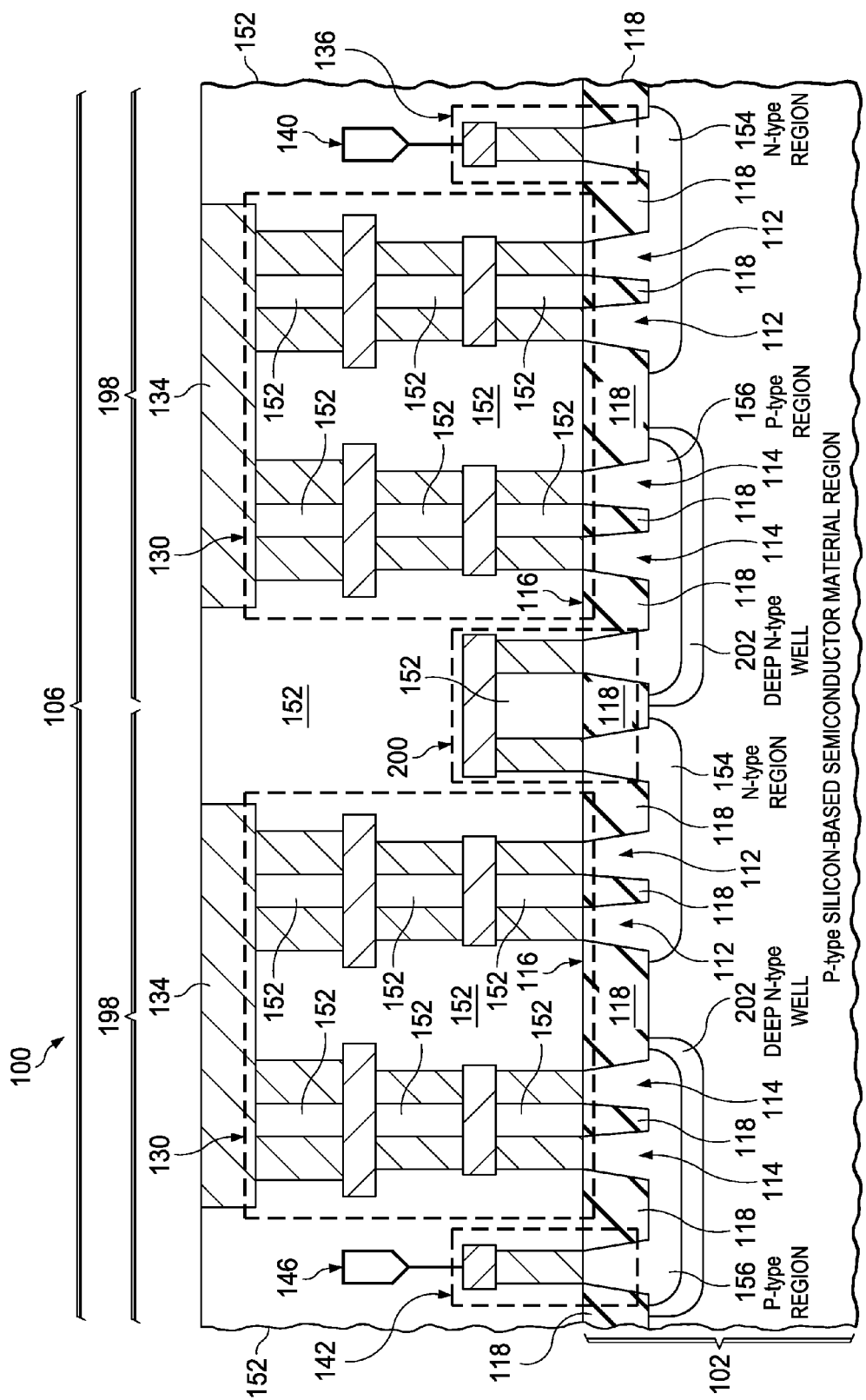
FIG. 7 is a cross section of another example integrated circuit containing CMOS transistors and an embedded thermoelectric device.

FIG. 7 is a cross section of another example integrated circuit containing CMOS transistors and an embedded thermoelectric device. The integrated circuit 100 is formed on a substrate 102 including silicon-based semiconductor material, as described in reference to FIG. 1. In the instant example, the silicon-based semiconductor material of the substrate 102 is p-type. The integrated circuit 100 includes CMOS transistors, not shown, and includes the embedded thermoelectric device 106. The embedded thermoelectric device 106 includes at least two stages 198 electrically connected in series; each stage 198 includes n-type thermoelectric elements 112 and p-type thermoelectric elements 114 in the substrate 102, extending to a top surface 116 of the substrate 102. The n-type thermoelectric elements 112 and p-type thermoelectric elements 114 are less than 300 nanometers wide at a narrowest position, for example at the top surface 116 of the substrate 102. The integrated circuit 100 includes field oxide 118 in isolation trenches laterally isolating active areas for the n-type and p-type thermoelectric elements 112 and 114. The embedded thermoelectric device 106 includes metal interconnect structures 130 which connects upper ends of the n-type thermoelectric elements 112 and the p-type thermoelectric elements 114 in each stage 198 to a thermal node 134 which is divided into segments as depicted in FIG. 7 to prevent electrically shorting the stages 198. The embedded thermoelectric device 106 also includes an n-type thermal tap 136 which connects lower ends of the n-type thermoelectric elements 112 in one stage 198 to a first terminal 140 of the embedded thermoelectric device 106, one or more intermediate thermal taps 200 which connect lower ends of the n-type thermoelectric elements 112 and p-type thermoelectric elements 114 in adjacent stages 198, and a p-type thermal tap 142 which connects lower ends of the p-type thermoelectric elements 114 to a second terminal 146 of the embedded thermoelectric device 106.

The n-type thermoelectric elements 112 in each stage 198 are disposed in a separate heavily doped n-type region 154 which encompasses the n-type thermoelectric elements 112 of the instant stage 198, the adjacent n-type thermal tap 136 or 200, and the substrate 102 between the n-type thermoelectric elements 112 at least 100 nanometers below the field oxide 118. The n-type region 154 for each stage 198 is separate from the n-type region 154 for every other stage 198, because each stage 198 will be at a different electrical potential (voltage) during operation of the embedded thermoelectric device 106 of the instant example.

The p-type thermoelectric elements 114 in each stage 198 are disposed in a separate heavily doped p-type region 156 which encompasses the p-type thermoelectric elements 114 of the instant stage 198, the adjacent p-type thermal tap 142 or 200, and the substrate 102 between the p-type thermoelectric elements 114 at least 100 nanometers below the field oxide 118. All but one, or possibly all, of the p-type regions 156 are disposed in one or more deep n-type wells 202 which electrically isolate the p-type regions 156 from the p-type silicon-based semiconductor material of the substrate 102. The p-type region 156 for each stage 198 is separate from the p-type region 156 for every other stage 198, because each stage 198 will be at a different electrical potential (voltage) during operation of the embedded thermoelectric device 106 of the instant example. The p-type regions 156 are electrically isolated from the p-type silicon-based semiconductor material of the substrate 102 to reduce undesired current between the p-type regions 156 at different potentials.

Forming the embedded thermoelectric device 106 with stages 198 electrically connected in series may advantageously increase a working voltage of the embedded thermoelectric device 106 to a more useful value. For example, when the embedded thermoelectric device 106 is used as a thermoelectric generator, each stage may generate a voltage of a few millivolts. An embedded thermoelectric generator having only one stage would not provide a useful voltage for many applications which may need at least 700 millivolts to operate transistors in a circuit. The embedded thermoelectric device 106 having a plurality of stages in series may advantageously provide enough voltage to operate a circuit with transistors. Similar considerations apply to embedded thermoelectric devices used for cooling or heating.

Figure 8:
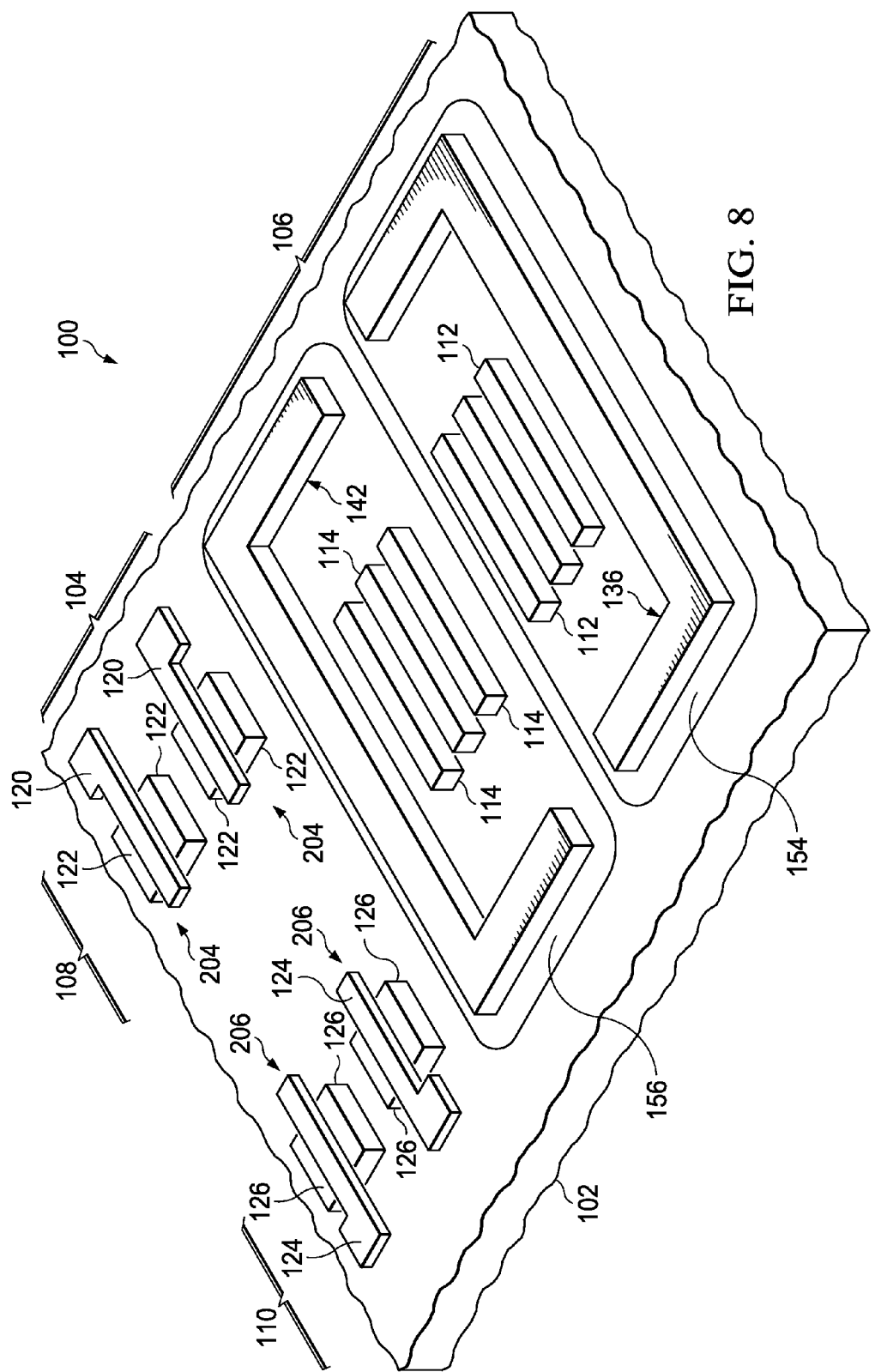
FIG. 8 and FIG. 9 are top views of example integrated circuits containing CMOS transistors and embedded thermoelectric devices.
Figure 9:
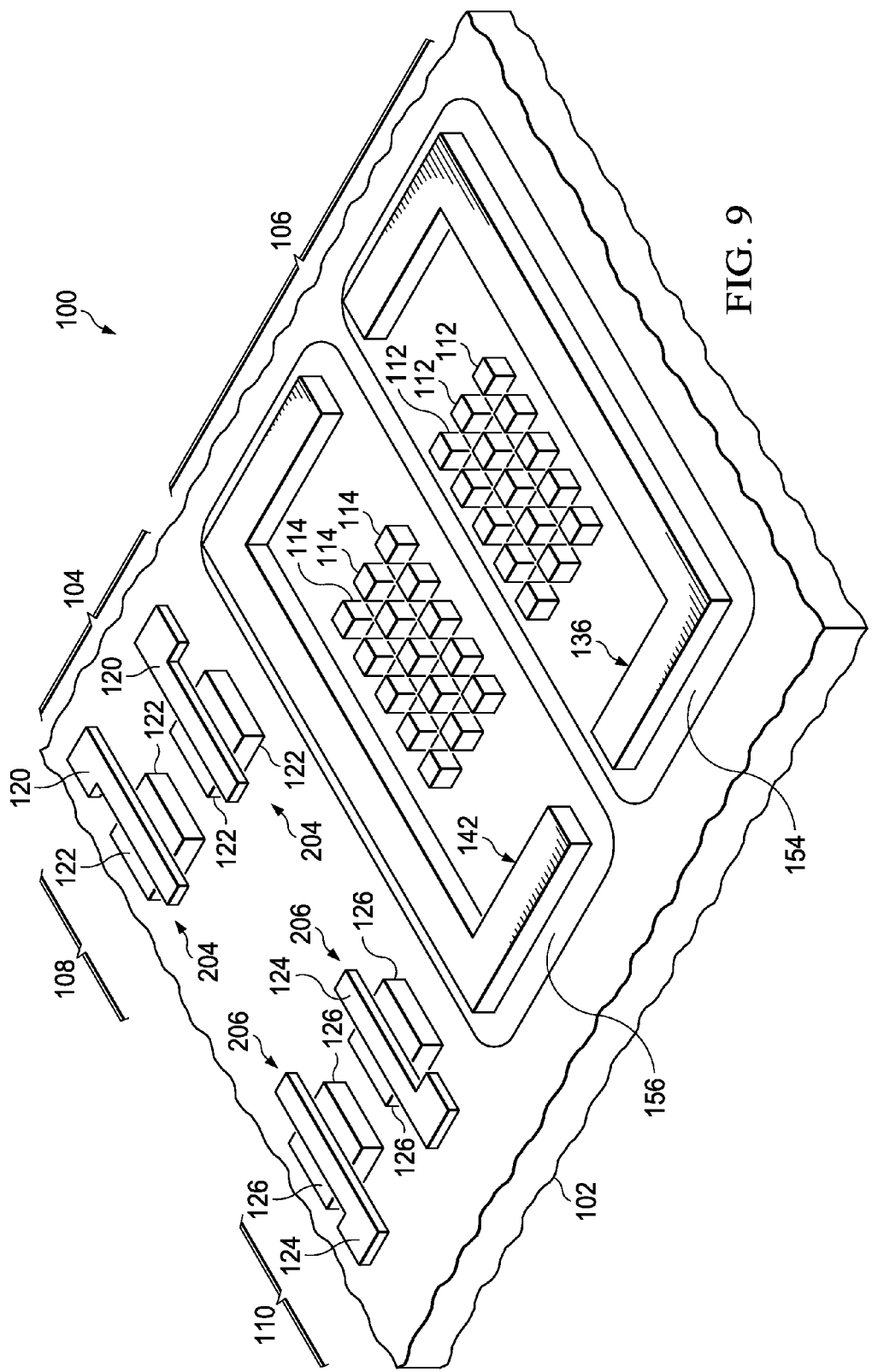

FIG. 8 and FIG. 9 are top views of example integrated circuits containing CMOS transistors and embedded thermoelectric devices. Referring to FIG. 8, the integrated circuit 100 is formed on a substrate 102 including silicon-based semiconductor material, as described in reference to FIG. 1. Field oxide is not shown in FIG. 8 to more clearly show the active areas of the integrated circuit 100. The integrated circuit 100 includes an area for the CMOS transistors 104 and an area for the embedded thermoelectric device 106.

The CMOS transistors 104 include NMOS transistors 108 and PMOS transistors 110. The NMOS transistors 108 are formed on active areas 204 and include n-type source/drain regions 122 in the active areas 204 and gate structures 120 over the active areas 204. The PMOS transistors 110 are formed on active areas 206 and include p-type source/drain regions 126 in the active areas 206 and gate structures 124 over the active areas 206.

The embedded thermoelectric device 106 includes n-type thermoelectric elements 112 and an n-type thermal tap 136 disposed in a heavily doped n-type region 154, and p-type thermoelectric elements 114 and a p-type thermal tap 142 disposed in a heavily doped p-type region 156. In the instant example, the n-type thermoelectric elements 112 and the p-type thermoelectric elements 114 are configured in arrays of linear active areas. Widths of the linear active areas of the n-type thermoelectric elements 112 and the p-type thermoelectric elements 114 may be less than 300 nanometers. Configuring the n-type and p-type thermoelectric elements 112 and 114 in the arrays of linear active areas may provide higher thermoelectric power generation density per unit area compared to other configurations of the arrays of the n-type and p-type thermoelectric elements 112 and 114, due to a higher density of active area. The integrated circuit 100 may be formed by any of the example process sequences described herein.

Referring to FIG. 9, the integrated circuit 100 is formed on a substrate 102 including silicon-based semiconductor material, as described in reference to FIG. 1. Field oxide is not shown in FIG. 8 to more clearly show the active areas of the integrated circuit 100. The integrated circuit 100 includes an area for the CMOS transistors 104 and an area for the embedded thermoelectric device 106.

The CMOS transistors 104 include NMOS transistors 108 and PMOS transistors 110. The NMOS transistors 108 are formed on active areas 204 and include n-type source/drain regions 122 in the active areas 204 and gate structures 120 over the active areas 204. The PMOS transistors 110 are formed on active areas 206 and include p-type source/drain regions 126 in the active areas 206 and gate structures 124 over the active areas 206.

The embedded thermoelectric device 106 includes n-type thermoelectric elements 112 and an n-type thermal tap 136 disposed in a heavily doped n-type region 154, and p-type thermoelectric elements 114 and a p-type thermal tap 142 disposed in a heavily doped p-type region 156. In the instant example, the n-type thermoelectric elements 112 and the p-type thermoelectric elements 114 are configured in rectangular arrays of pillar active areas. Widths and lengths of the pillar active areas of the n-type thermoelectric elements 112 and the p-type thermoelectric elements 114 may be less than 300 nanometers. Configuring the n-type and p-type thermoelectric elements 112 and 114 in the rectangular arrays of pillar active areas may provide higher thermoelectric power generation efficiency compared to other configurations of the arrays of the n-type and p-type thermoelectric elements 112 and 114, due to reduced thermal conduction in the pillar active areas from phonon scattering at sides of the pillar active areas. The integrated circuit 100 may be formed by any of the example process sequences described herein.

Although illustrative embodiments have been shown and described by way of example, a wide range of alternative embodiments is possible within the scope of the foregoing disclosure.

What is claimed is:
1. An integrated circuit, comprising:
a substrate comprising silicon-based semiconductor material;
field oxide in isolation trenches in the substrate, the field oxide providing lateral isolation between active areas of the integrated circuit;

an area for complementary metal oxide semiconductor (CMOS) transistors comprising an n-channel metal oxide semiconductor (NMOS) transistor and a p-channel metal oxide semiconductor (PMOS) transistor;

an embedded thermoelectric device comprising:
  n-type thermoelectric elements in a plurality of the active areas, the n-type thermoelectric elements being less than 300 nanometers wide at a narrowest position;
  an n-type region in the substrate which encompasses the n-type thermoelectric elements and the substrate between the n-type thermoelectric elements at least 100 nanometers below the field oxide, the n-type region having a doping density of at least $1 \times 10^{18}$ cm$^{-3}$ throughout the n-type thermoelectric elements and the substrate between the n-type thermoelectric elements at least 100 nanometers below the field oxide;
  p-type thermoelectric elements in a plurality of the active areas, the p-type thermoelectric elements being less than 300 nanometers wide at a narrowest position; and
  a p-type region in the substrate which encompasses the p-type thermoelectric elements and the substrate between the p-type thermoelectric elements at least 100 nanometers below the field oxide, the p-type region having a doping density of at least $1 \times 10^{18}$ cm$^{-3}$ throughout the p-type thermoelectric elements and the substrate between the p-type thermoelectric elements at least 100 nanometers below the field oxide; and
  a metal interconnect structure which connects upper ends of the n-type thermoelectric elements and the p-type thermoelectric elements to a thermal node.

2. The integrated circuit of claim 1, wherein the embedded thermoelectric device further comprises:
  an n-type thermal tap in at least one of the active areas adjacent to the n-type thermoelectric elements, the n-type region encompassing the n-type thermal tap; and
  a p-type thermal tap in at least one of the active areas adjacent to the p-type thermoelectric elements, the p-type region encompassing the p-type thermal tap.

3. The integrated circuit of claim 1, wherein the silicon-based semiconductor material of the substrate is p-type and the embedded thermoelectric device further comprises a deep n-type well surrounding the p-type region so as to electrically isolate the p-type region from the p-type silicon-based semiconductor material of the substrate.

4. The integrated circuit of claim 1, wherein the n-type region is doped with at least one n-type dopant selected from the group consisting of phosphorus, arsenic and antimony.

5. The integrated circuit of claim 1, wherein the p-type region is doped with at least one p-type dopant selected from the group consisting of boron, gallium and indium.

* * * * *